United States Patent
Shin et al.

(10) Patent No.: US 10,910,792 B2
(45) Date of Patent: Feb. 2, 2021

(54) HYBRID SILICON LASERS ON BULK SILICON SUBSTRATES

(71) Applicant: Samsung Electronics Co., Ltd., Suwon-si (KR)

(72) Inventors: Dong-jae Shin, Seoul (KR); Dong-hyun Kim, Cheonan-si (KR); Seong-gu Kim, Pyeongtaek-si (KR); In-sung Joe, Seoul (KR); Kyoung-ho Ha, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/431,344

(22) Filed: Jun. 4, 2019

(65) Prior Publication Data
US 2019/0288485 A1 Sep. 19, 2019

Related U.S. Application Data

(63) Continuation of application No. 14/833,406, filed on Aug. 24, 2015, now abandoned.

(30) Foreign Application Priority Data

Sep. 30, 2014 (KR) .................. 10-2014-0132019

(51) Int. Cl.
*H01S 5/02* (2006.01)
*H01S 5/20* (2006.01)
(Continued)

(52) U.S. Cl.
CPC ............. *H01S 5/2031* (2013.01); *G02B 6/12* (2013.01); *H01S 5/1032* (2013.01);
(Continued)

(58) Field of Classification Search
CPC .... H01S 5/0206; H01S 5/2031; H01S 5/1032; H01S 5/021
See application file for complete search history.

(56) References Cited

U.S. PATENT DOCUMENTS 6,387,742 B2   5/2002   Gauthier, Jr. et al.
6,897,498 B2   5/2005   Gothoskar et al.
(Continued)

FOREIGN PATENT DOCUMENTS

JP   2005-223111       8/2005
KR   10-0331441 B1    10/2002
(Continued)

OTHER PUBLICATIONS

McConnell et al., "Thermal Conductivity of Doped Polysilicon Layers," Journal of Microelectromechanical Systems, vol. 10, No. 3, Sep. 2001, oo. 360-369.
(Continued)

*Primary Examiner* — Michael Carter
(74) *Attorney, Agent, or Firm* — Muir Patent Law, PLLC

(57) ABSTRACT

Hybrid silicon lasers are provided including a bulk silicon substrate, a localized insulating layer that extends on at least a portion of the bulk silicon substrate, an optical waveguide structure on an upper surface of the localized insulating layer. The optical waveguide structure includes an optical waveguide including a silicon layer. A lasing structure is provided on the optical waveguide structure.

19 Claims, 23 Drawing Sheets

(51) Int. Cl.
    *G02B 6/12*     (2006.01)
    *H01S 5/10*     (2006.01)
    *H01S 5/22*     (2006.01)
    *H01S 5/026*     (2006.01)
    *H01S 5/042*     (2006.01)
    *H01S 5/14*     (2006.01)
    *H01S 5/223*     (2006.01)
    *H01S 5/227*     (2006.01)
    *H01S 5/343*     (2006.01)

(52) U.S. Cl.
    CPC ............. *G02B 2006/12061* (2013.01); *G02B 2006/12121* (2013.01); *H01S 5/021* (2013.01); *H01S 5/026* (2013.01); *H01S 5/0422* (2013.01); *H01S 5/14* (2013.01); *H01S 5/141* (2013.01); *H01S 5/22* (2013.01); *H01S 5/227* (2013.01); *H01S 5/2232* (2013.01); *H01S 5/34306* (2013.01)

(56) References Cited

U.S. PATENT DOCUMENTS

| | | |
|---|---|---|
| 7,639,719 B2 | 12/2009 | Fang et al. |
| 7,715,458 B2 * | 5/2010 | Kim .......................... H01S 5/12 372/50.11 |
| 8,017,420 B2 | 9/2011 | Kim et al. |
| 8,098,968 B2 | 1/2012 | Green et al. |
| 8,110,823 B2 | 2/2012 | Bowers |
| 8,150,223 B2 | 4/2012 | Li et al. |
| 2001/0030372 A1 * | 10/2001 | Mori .................... H01L 27/1104 257/304 |
| 2002/0001864 A1 | 1/2002 | Ishikawa et al. |
| 2002/0047123 A1 | 4/2002 | Ramdani |
| 2003/0059969 A1 | 3/2003 | Minato et al. |
| 2008/0002929 A1 | 1/2008 | Bowers et al. |
| 2010/0040102 A1 | 2/2010 | Ahn |
| 2011/0133063 A1 * | 6/2011 | Ji ........................... G02B 6/122 250/227.24 |
| 2011/0194803 A1 | 8/2011 | Shin et al. |
| 2011/0235962 A1 | 9/2011 | Shubin et al. |
| 2011/0299561 A1 * | 12/2011 | Akiyama ............ H01S 5/02248 372/50.11 |
| 2012/0002694 A1 | 1/2012 | Bowers et al. |
| 2012/0300796 A1 * | 11/2012 | Sysak .................... H01S 5/1032 372/6 |
| 2012/0320939 A1 * | 12/2012 | Baets .................... H01S 5/1032 372/45.01 |
| 2013/0285184 A1 | 10/2013 | Li |

FOREIGN PATENT DOCUMENTS

| | | |
|---|---|---|
| KR | 10-2013-0102528 A | 9/2013 |
| KR | 10-2014-0006078 A | 1/2014 |

OTHER PUBLICATIONS

First Office Action dated Mar. 30, 2020 for corresponding Korean application No. KR 10-2014-0132019.

* cited by examiner

HYBRID SILICON LASERS ON BULK SILICON SUBSTRATES

CROSS-REFERENCE TO RELATED APPLICATIONS

This application is a continuation of U.S. application Ser. No. 14/833,406 filed on Aug. 24, 2015, which claims the benefit of Korean Patent Application No. 10-2014-0132019, filed Sep. 30, 2014, in the Korean Intellectual Property Office, the disclosure of each of which is hereby incorporated herein by reference as if set forth in its entirety.

FIELD

The inventive concept relates generally to lasers, and more particularly, to a hybrid silicon laser embodied on a bulk silicon substrate.

BACKGROUND

An optical integrated circuit (IC) device is a compact device obtained by integrating a light source, for example, a laser, and an electric device on a single substrate. Like an electronic IC device, it may be necessary to embody the optical IC device on a silicon substrate. Furthermore, it may be necessary to embody the light source, for example, a laser, forming the optical IC device, on a bulk silicon substrate that easily dissipates heat and is inexpensive.

SUMMARY

Some embodiments of the present inventive concept provide hybrid silicon lasers embodied on a bulk silicon substrate. Hybrid silicon lasers as discussed herein may be easily integrated with an electric integrated circuit (IC), easily dissipate heat, and inexpensive.

Some embodiments of the present inventive concept provide a hybrid silicon laser including a bulk silicon substrate, a localized insulating layer formed in a partial area of the bulk silicon substrate, an optical waveguide structure formed on an upper surface of the localized insulating layer and including an optical waveguide formed as a silicon layer, and a lasing structure provided above the optical waveguide structure.

In further embodiments, the localized insulating layer may be a buried insulating layer that is buried in a bulk trench formed in the bulk silicon substrate. The silicon layer may be a crystallized silicon layer. A center point of the optical guide may be deviated from a center point of the localized insulating layer.

In still further embodiments, the lasing structure may include a Group III-V semiconductor gain layer coupled to the optical waveguide structure. The lasing structure may include a Group III-V semiconductor gain layer or a Group III-V semiconductor crystalline layer, and the Group III-V semiconductor gain layer or a Group III-V semiconductor crystalline layer is a layer which is crystal-grown on the optical waveguide structure. The lasing structure may be a mesa type structure or a ridge type structure.

In some embodiments, the lasing structure may include a light-emitting composite layer and a clad layer that is formed on the light-emitting composite layer. A buffer layer for crystal growth may be formed on the optical waveguide structure. A combining medium layer for combining the lasing structure and the optical waveguide structure may be formed between the lasing structure and the optical waveguide structure.

Further embodiments of the present inventive concept provide a hybrid silicon laser including a bulk silicon substrate, a localized insulating layer formed in a partial area of the bulk silicon substrate, an optical waveguide structure formed on the bulk silicon substrate and the localized insulating layer, and a lasing structure provided above the optical waveguide structure.

In still further embodiments, the structure may include a silicon layer formed on the bulk silicon substrate and the localized insulating layer, an optical guide layer formed in the silicon layer, and an optical waveguide defined by the optical guide layer. The optical guide layer may be provided in a trench formed at opposite sides of the optical guide in the silicon layer and include a material layer having a refractive index lower than that of the silicon layer.

In some embodiments, the lasing structure may be a Group III-V semiconductor gain layer. The lasing structure may include a light-emitting composite layer formed on the optical waveguide structure and a clad layer formed on the light-emitting composite layer. The light-emitting composite layer may include a light-emitting layer configured to emit light, a first separate confinement heterostructure layer formed between the optical waveguide structure and the light-emitting layer, and a second separate confinement heterostructure layer formed on the light-emitting layer.

In further embodiments, an electric connection layer may be formed on the optical waveguide structure and between the light-emitting composite layer and the optical waveguide structure. A buffer layer for crystal growth may be formed between the optical waveguide structure and the electric connection layer. A combining medium layer for combining the lasing structure and the optical waveguide structure may be formed between the optical waveguide structure and the electric connection layer.

In still further embodiments, a current confinement impurity region for confining injection of current may be formed in the light-emitting composite layer and the clad layer. A current confinement layer for confining injection of current may be formed in the light-emitting composite layer.

Some embodiments of the present inventive concept provide a hybrid silicon laser including a bulk silicon substrate, a localized insulating layer formed in a partial area of the bulk silicon substrate, an optical waveguide structure including a silicon layer formed on the bulk silicon substrate and the localized insulating layer, an optical guide layer formed in the silicon layer, and an optical waveguide defined by the optical guide layer, and a lasing structure including a first electric connection layer formed on the optical waveguide structure, a light-emitting composite layer formed on the first electric connection layer, and a clad layer formed on the light-emitting composite layer.

In further embodiments, the optical guide layer may be a gas layer formed in a trench that is formed in the silicon layer with respect to the optical guide. The light-emitting composite layer may include a light-emitting layer that is formed of a quantum well or a quantum dot.

In still further embodiments, the lasing structure may be a mesa type or ridge type structure, and a side wall insulating layer is formed at opposite side walls of the mesa type or ridge type structure. A second electric connection layer may be formed on the clad layer.

In some embodiments, the first electric terminal and a second electric terminal may be formed on each of the first electric connection layer and the second electric connection layer.

Further embodiments of the present inventive concept provide a hybrid silicon laser including a bulk silicon substrate, a localized insulating layer formed in a partial area in the vicinity of the bulk silicon substrate, a silicon layer formed on the bulk silicon substrate and the localized insulating layer, a plurality of optical guide layers formed separated from one another in the vicinity of a surface of the silicon layer, an optical waveguide defined by the plurality of optical guide layers and formed as the silicon layer on the localized insulating layer, a first electric connection layer formed on the silicon layer and the plurality of optical guide layers, a light-emitting composite layer formed on the first electric connection layer, and a clad layer formed on the light-emitting composite layer.

In still further embodiments, the light-emitting composite layer may include a light-emitting layer configured to emit light, and first and second separate confinement heterostructure layers respectively formed on lower and upper sides of the light-emitting layer.

In some embodiments, a second electric connection layer may be formed on the clad layer, and first and second electric terminals may be respectively formed on the first and second electric connection layers.

In further embodiments, a current confinement impurity region for confining injection of current into the light-emitting layer may be formed in the clad layer, the first separate confinement heterostructure layer, and the second separate confinement heterostructure layer. A current confinement layer for confining injection of current into the light-emitting layer may be formed on the light-emitting layer. The current confinement layer may be formed between the light-emitting layer and the second separate confinement heterostructure layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
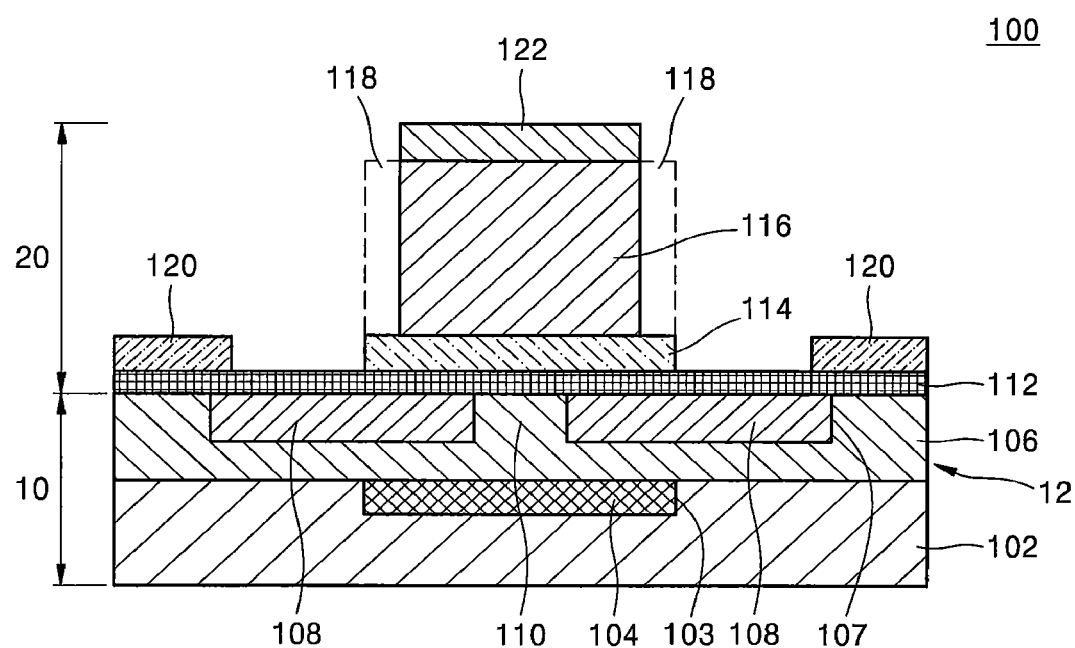
FIG. 1 is a cross-section of a hybrid silicon laser according to some embodiments of the present inventive concept.

Hereinafter, the present inventive concept will be described in detail by explaining example embodiments of the inventive concept with reference to the attached drawings.

This inventive concept may, however, be embodied in many different forms and should not be construed as limited to the exemplary embodiments set forth herein. Rather, these embodiments are provided so that this disclosure will be thorough and complete, and will fully convey the scope of the inventive concept to one of ordinary skill in the art. Sizes of components in the drawings may be exaggerated for convenience of explanation. In other words, since sizes and thicknesses of components in the drawings are arbitrarily illustrated for convenience of explanation, the following embodiments are not limited thereto.

In the present specification, when a constituent element "connects" or is "connected" to another constituent element, the constituent element contacts or is connected to the other constituent element directly or through at least one of other constituent elements. Conversely, when a constituent element is described to "directly connect" or to be "directly connected" to another constituent element, the constituent element should be construed to be directly connected to another constituent element without any other constituent element interposed therebetween. Other expressions, such as, "between" and "directly between," describing the relationship between the constituent elements, may be construed in the same manner.

Terms such as "first" and "second" are used herein merely to describe a variety of constituent elements, but the constituent elements are not limited by the terms. Such terms are used only for the purpose of distinguishing one constituent element from another constituent element. For example, without departing from the right scope of the present inventive concept, a first constituent element may be referred to as a second constituent element, and vice versa.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limit exemplary embodiments. As used herein, the singular forms "a," "an," and "the" are intended to include the plural forms as well, unless the context clearly indicates otherwise. It will be further understood that terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing.

The following exemplary embodiments may be configured as a single embodiment or a plurality of embodiments. The hybrid silicon laser discussed herein may provide light that is electrically and optically pumped. The light generated by a hybrid silicon laser may be pumped by using, for example, electric energy and/or light energy. The hybrid silicon laser may be embodied on a bulk silicon substrate and may be embodied with a silicon based complementary metal-oxide semiconductor (CMOS) device.

The hybrid silicon laser may produce light that is used to encode and transmit data. The hybrid silicon laser may produce coherent light through a light amplification process based on emission of photons. The light produced by the hybrid silicon laser may be, for example, an infrared ray, a visible ray, an ultraviolet ray, or electromagnetic radiation in an X-ray range of the electromagnetic spectrum. An example of a detailed structure of the hybrid silicon laser is discussed herein. Since the scale of drawings of the present specification is illustrated for convenience of explanation, it will be understood that the present inventive concept is not limited to the scale of the drawings.

Referring first to FIG. 1, a cross-section of a hybrid silicon laser 100 according to some embodiments of the present inventive concept will be discussed. In particular, as illustrated in FIG. 1, the hybrid silicon laser 100 may be embodied on a bulk silicon substrate 102 rather than a silicon-on-insulator (SOI) substrate. The bulk silicon substrate 102 may be, for example, a single-crystal silicon substrate. The hybrid silicon laser 100 may include a silicon optical waveguide structure 10 and a lasing structure 20.

The silicon optical waveguide structure 10 may include a localized insulating layer 104 formed in a partial area of the bulk silicon substrate 102 and an optical waveguide structure 12 formed on an upper surface of the localized insulating layer 104 and including an optical waveguide 110 of the silicon layer 106. The optical waveguide structure 12 may be formed on an upper surface of the bulk silicon substrate 102.

The lasing structure 20 may be provided on the optical waveguide structure 12. The lasing structure 20 may include a light emitting layer that emits light, referred to herein as lasing. The light emitted from the lasing structure 20 is optically connected to the optical waveguide 110 of the optical waveguide structure 12 so as to transmit light to the outside.

In particular, the hybrid silicon laser 100 may be provided on the bulk silicon substrate 102 where the localized insulating layer 104 is formed. The localized insulating layer 104 may be formed in a partial area in the vicinity of a surface of the bulk silicon substrate 102. The localized insulating layer 104 may be a buried insulating layer that is buried in a bulk trench 103 formed in the bulk silicon substrate 102. The localized insulating layer 104 may be, for example, a silicon oxide ($SiO_2$) layer, a silicon oxynitride (SiON) layer, a silicon nitride (SiN) layer and the like.

The optical waveguide structure 12 may include the silicon layer 106 formed on the bulk silicon substrate 102 and the localized insulating layer 104, an optical guide layer 108 formed in the silicon layer 106, and the optical waveguide 110 defined by the optical guide layer 108. The optical guide layer 108 may be provided in a multiple number to be separated from each other in vicinity of a surface of the silicon layer 106. The optical guide layer 108 is extended to an outer edge of the lasing structure 20. The optical guide layer 108 may be extended over the opposite walls of the localized insulating layer 104.

The optical waveguide 110 may be formed as the silicon layer 106. The silicon layer 106 may be formed above the localized insulating layer 104. The optical waveguide 110 that is defined by the optical guide layer 108 may be located above the localized insulating layer 104. The silicon layer 106 may be a crystallized silicon layer. The silicon layer 106 may be an impurity-doped crystallized silicon layer. The silicon layer 106 may be a single-crystal silicon layer.

The silicon layer 106 may be formed by forming an amorphous silicon layer on the bulk silicon substrate 102 and the localized insulating layer 104 and crystallizing the amorphous silicon layer, as will be discussed below. The crystallization of the amorphous silicon layer will be discussed further below.

The optical waveguide 110 may be surrounded by the optical guide layer 108 that is formed at the opposite sides of the optical waveguide 110 and each have a refractive index lower than that of a material forming the optical waveguide 110, for example, the silicon layer 106. The optical waveguide 110 illustrated in FIG. 1 may be a rib waveguide. It will be understood that embodiments of the present inventive concept are not limited to this configuration. For example, the optical waveguide 110 may be formed as a stripe waveguide or a circular waveguide without departing from the scope of the present inventive concept.

The optical guide layer 108 may be formed in a trench 107 formed in the silicon layer 106 with respect to the optical waveguide 110. When the optical guide layer 108 is formed as an empty space, the optical guide layer 108 may be a gas layer. For example, the gas layer may be comprised of air or an inert gas, such as argon or nitrogen. When the optical guide layer 108 is formed as a material layer filling the trench 107, the material layer may be, for example, a silicon oxide layer, a silicon nitride layer, a silicon oxynitride layer, a polymer layer, a spin-on-glass layer and the like.

The lasing structure 20 may include, for example, a Group III-V semiconductor gain layer coupled to the optical waveguide structure 12, a Group III-V semiconductor gain layer or a Group III-V semiconductor crystalline layer. The Group III-V semiconductor gain layer or Group III-V semiconductor crystalline layer is a layer which is crystal-grown on the optical waveguide structure 12. In some embodiments, the lasing structure 20 may be formed in a mesa type structure.

As illustrating in FIG. 1, the lasing structure 20 may include a light-emitting composite layer 114, a clad layer 116 formed on the light-emitting composite layer 114, and a second electric terminal 122 formed on the clad layer 116. The light-emitting composite layer 114 may include a light emitting layer (active layer) that may emit light in response to an electric energy input. The light emitted from light-emitting composite layer 114, that is, the light emitting layer, may be optically connected to the optical waveguide 110 of the optical waveguide structure 12. The structure of the light-emitting composite layer 114 will be discussed further below.

A first electric connection layer 112 may be formed on the optical waveguide structure 12 as the lasing structure 20. The first electric connection layer 112 may be used to electrically connect a first electric terminal 120 to the light-emitting composite layer 114. The hybrid silicon laser 100 may have a structure to supply current to the first electric terminal 120 and the second electric terminal 122. The first electric terminal 120 may be configured as a minus terminal and the second electric terminal 122 may be configured as a plus terminal.

The current may flow from the second electric terminal 122 to the first electric terminal 120 through the light-emitting composite layer 114 and clad layer 116. The first electric connection layer 112 may be n-type indium phosphorus (n-InP). The n-InP may be silicon-doped InP. In some embodiments, the first electric connection layer 112 may include, for example, a doping layer including elements in III and V groups of the periodic table. The first electric terminal 120 and the second electric terminal 122 may be formed of metal, for example, Au, Pt, Cu, and/or Al.

The clad layer 116 may be formed of p-type indium phosphorus (p-InP) and may include a plurality of material layers. The clad layer 116 may be Zn-doped InP. The width of the clad layer 116 may be smaller than that of the light-emitting composite layer 114. A side wall insulating layer 118 that restricts a current path through the clad layer 116 between the light-emitting composite layer 114 and the second electric terminal 122 may be formed on the opposite side walls of the clad layer 116 and on the light-emitting composite layer 114. The side wall insulating layer 118 may be, for example, air, a silicon oxide layer, a silicon oxynitride layer, a silicon nitride layer, a polymer layer, a spin-on-glass layer and the like.

Figure 2:
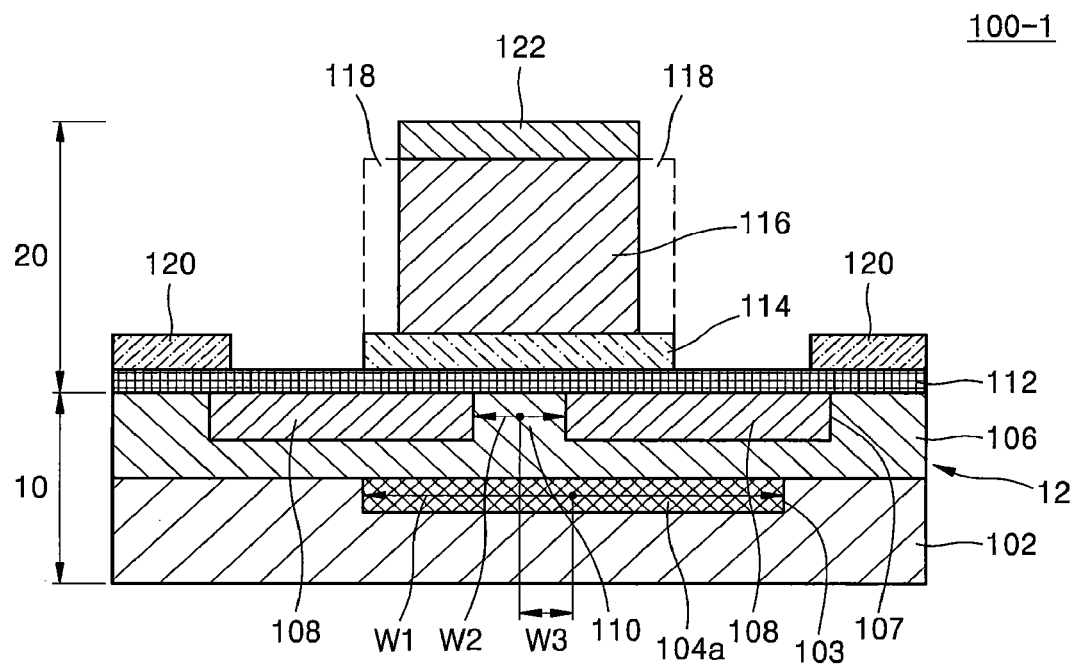
FIG. 2 is a cross-section of a hybrid silicon laser according to some embodiments of the present inventive concept.

Referring now to FIG. 2, a cross-section of a hybrid silicon laser 100-1 according to some embodiments of the present inventive concept will be discussed. As illustrated in FIG. 2, the hybrid silicon laser 100-1 of FIG. 2 is substantially the same as the hybrid silicon laser 100 of FIG. 1, except for the position where a localized insulating layer 104a is formed. Accordingly, details with respect to common structures will not be repeated herein in the interest of brevity.

The hybrid silicon laser 100-1 may include the localized insulating layer 104a formed in a bulk trench 103 of the bulk silicon substrate 102. The localized insulating layer 104a may have a width W1. The localized insulating layer 104a may be located under the optical waveguide 110 and may be configured in a variety of sizes. The width W1 of the localized insulating layer 104a of FIG. 2 may be larger than that of the localized insulating layer 104 of FIG. 1.

The silicon layer 106 may be formed on the bulk silicon substrate 102 and the localized insulating layer 104a. The optical guide layer 108 may be formed in the silicon layer 106. The optical waveguide 110 may be defined by the optical guide layer 108. The optical waveguide 110 that is defined by the optical guide layer 108 may be located above the localized insulating layer 104a.

A center point of a section of the optical waveguide 110 may be deviated by a distance W3 from a center point of a section of the localized insulating layer 104a. In the illustrated configuration, the likelihood that a crystal defect that may be generated in the silicon layer 106 located above the center point of the localized insulating layer 104a, during a process of manufacturing the silicon layer 106, may be reduced or possibly avoided.

Figure 3:
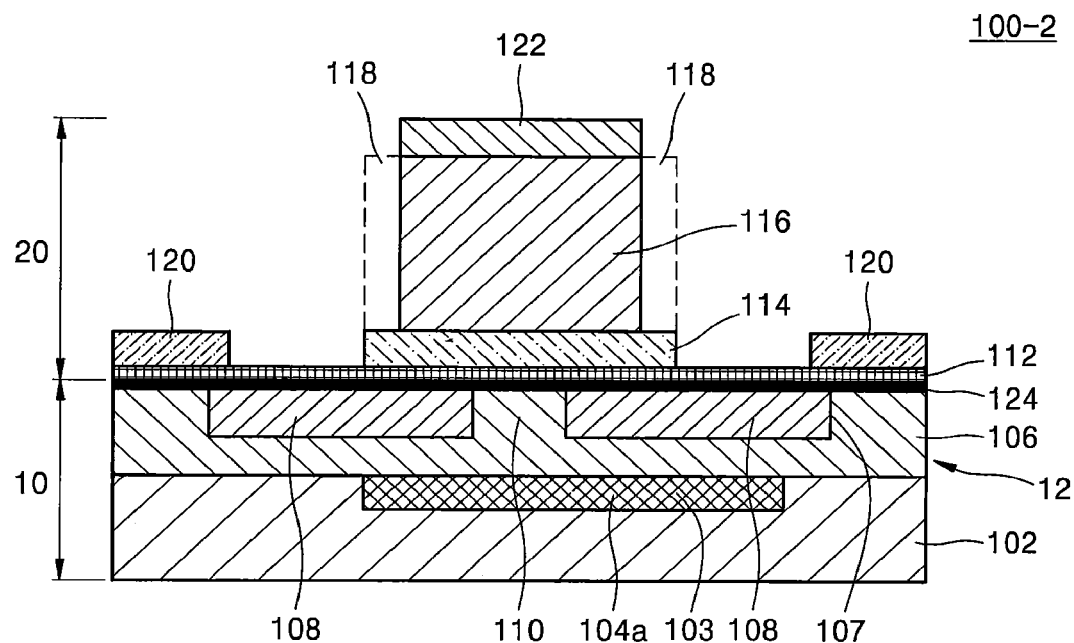
FIG. 3 is a cross-section of a hybrid silicon laser according to some embodiments of the present inventive concept.

Referring now to FIG. 3, a cross-section of a hybrid silicon laser 100-2 according to some embodiments of the present inventive concept will be discussed. As illustrated in FIG. 3, the hybrid silicon laser 100-2 of FIG. 3 is substantially the same as the hybrid silicon laser 100-1 of FIG. 2, except that an intermediate medium layer 124 is formed on the optical waveguide structure 12. Accordingly, details with respect to common structures will not be repeated herein in the interest of brevity.

In the hybrid silicon laser 100-2, the intermediate medium layer 124 may be formed on the optical waveguide structure 12. The intermediate medium layer 124 may be formed on the silicon layer 106 and the optical guide layer 108. The intermediate medium layer 124 may be a buffer layer for crystal growth to facilitate crystal growth on the optical waveguide structure 12. Furthermore, the intermediate medium layer 124 may be a combining medium layer for combining the lasing structure 20 and the optical waveguide structure 12, which is provided between the lasing structure 20 and the optical waveguide structure 12.

In the hybrid silicon laser 100-2 as illustrated, when the intermediate medium layer 124 is provided on the optical waveguide structure 12, the lasing structure 20 may be easily formed on the optical waveguide structure 12.

Figure 4:
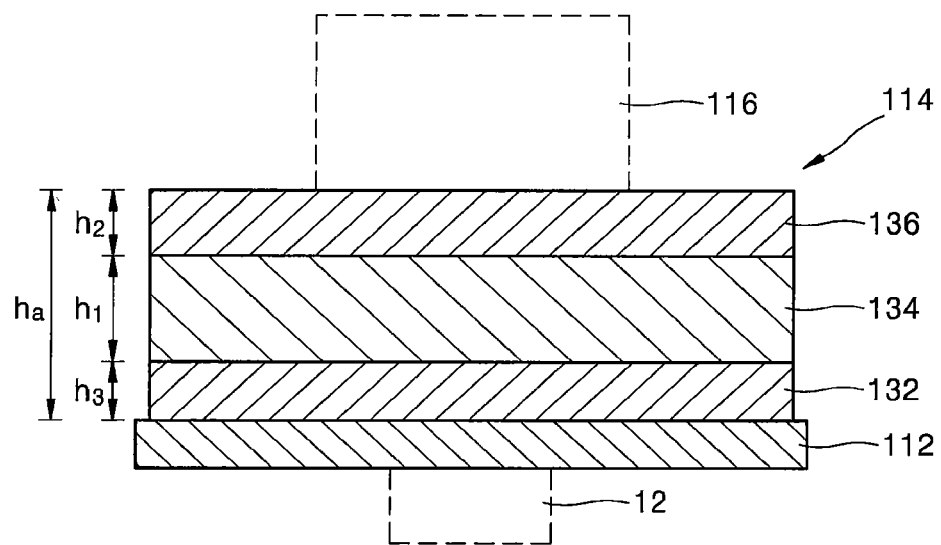
FIG. 4 is a cross-section illustrating an example of a light-emitting composite layer of FIGS. 1 to 3 according to some embodiments of the present inventive concept.

Referring now to FIG. 4, a cross-section illustrating an example of the light-emitting composite layer 114 of FIGS. 1 to 3 will be discussed. As illustrated in FIG. 4, the light-emitting composite layer 114 may include a light-emitting layer 134 and separate confinement heterostructure (SCH) layers 132 and 136 formed on upper and lower portions of the light-emitting layer 134. The separate confinement heterostructure layers 132 and 136 may include the first electric connection layer 112, that is, the first separate confinement heterostructure layer 132 formed between the optical waveguide structure 12 and the light-emitting layer 134. The separate confinement heterostructure layers 132 and 136 may include the second separate confinement heterostructure layer 136 formed on an upper portion of the light-emitting layer 134 and on a lower portion of the clad layer 116.

The light-emitting layer 134 may be configured as a multiple quantum well (MQW) that is formed of Group III-V semiconductor materials including elements of 3A and 5A groups of the periodic table, such as, AlGaInAs, InAlGaAs, GaAs/GaAlAs, and/or InGaAsP. The quantum well may be formed by inserting a material having a lower bandgap between materials having wider bandgaps. For example, the quantum well may be configured as one GaAs layer between two AlAs layers or one GaAs layer between two GaAlAs layers. The quantum well may be formed by using, for example, molecular beam epitaxy or chemical vapour deposition technology.

The separate confinement heterostructure layers 132 and 136 are layers formed of a material having a refractive index lower than that of the light-emitting layer 134 formed as quantum wells. The separate confinement heterostructure layers 132 and 136 may be formed of Group III-V materials, such as AlGaInAs, InGaAsP, and/or GaAs. The first separate confinement heterostructure layer 132 may be formed of a material that is different from that of the second separate confinement heterostructure layer 136. The separate confinement heterostructure layers 132 and 136 may be a p-type layer or an n-type layer.

The height "$h_a$" of the light-emitting composite layer 114 may be a sum of the height (thickness) "$h_1$" of the light-emitting layer 134 and the heights "$h_2$" and "$h_3$" of the separate confinement heterostructure layers 132 and 136. In some embodiments, the refractive index of each of the separate confinement heterostructure layers 132 and 136 may be between about 3.2 and about 3.3, and the refractive index of the light-emitting layer 134 may be about 3.5.

In some embodiments, with respect to the light-emitting composite layer 114 having a refractive index between about 3.2 and about 3.5, the height "$h_a$" of the light-emitting composite layer 114 may be between about 40 nm and about 400 nm. In some embodiments, the height "ha" of the light-emitting composite layer 114 may be between about 50 nm and about 340 nm or between about 70 nm and about 330 nm.

For example, when the refractive index of the light-emitting composite layer 114 is about 3.34, the thickness of the light-emitting composite layer 114 may be less than about 400 nm. When the refractive index of the light-emitting composite layer 114 is about 3.4, the thickness of the light-emitting composite layer 114 may be less than about 160 nm. When the refractive index of the light-emitting composite layer 114 is about 3.5, the thickness of the light-emitting composite layer 114 may be less than about 80 nm.

In some embodiments, the height "$h_1$" of the light-emitting layer 134 may be between about 7 nm and about 80 nm. In some embodiments, each of the heights "$h_2$" and "$h_3$" of the separate confinement heterostructure layers 132 and 136 may be between about 20 nm and about 200 nm. The heights "$h_2$" and "$h_3$" of the separate confinement heterostructure layers 132 and 136 may have the same thickness or different thicknesses.

Figure 5:
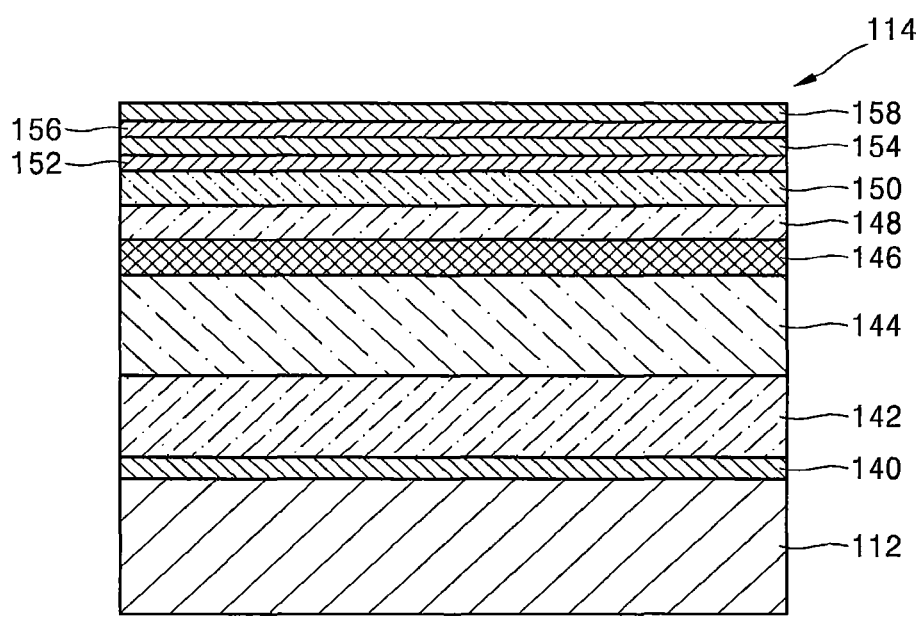
FIG. 5 is a cross-section illustrating an example of the light-emitting composite layer of FIGS. 1 to 3 according to some embodiments of the present inventive concept.

Referring now to FIG. 5, a cross-section illustrating an example of the light-emitting composite layer 114 of FIGS. 1 to 3 according to some embodiments of the present inventive concept will be discussed. In particular, the light-emitting composite layer 114 may include a light-emitting layer 146 including a quantum dot formed of, for example, GaAs, InAs, and InGaAs. The quantum dot is a fine crystal of a semiconductor material in which states of electrons and holes are quantized. The electronic characteristics of a quantum dot are related to the size and shape of a quantum dot particle. The quantum dot may be formed by, for example, molecular beam epitaxy technology or metal-organic chemical vapour deposition technology.

For example, the light-emitting composite layer 114 may include an AlGaAs etch stop layer 140, a GaAs P-clad layer (Be-doped GaAs layer) 142, an AlGaAs P-clad layer (Be-doped AlGaAs layer) 144, the light-emitting layer 146 including a GaAs quantum dot, an N-AlGaAs layer (Si-doped AlGaAs layer) 148, an N-GaAs layer (Si-doped GaAs layer) 150, and AlGaAs/GaAs superlattice layers 152, 154, 156, and 158, on the first electric connection layer 112.

As such, the light-emitting composite layer 114 may include the light-emitting layer 146 including a quantum dot. The light-emitting composite layer 114 has been discussed with respect to various materials etc., but should not be limited to the examples discussed herein. Many other materials may be used without departing from the scope of the present inventive concept.

Figure 6:
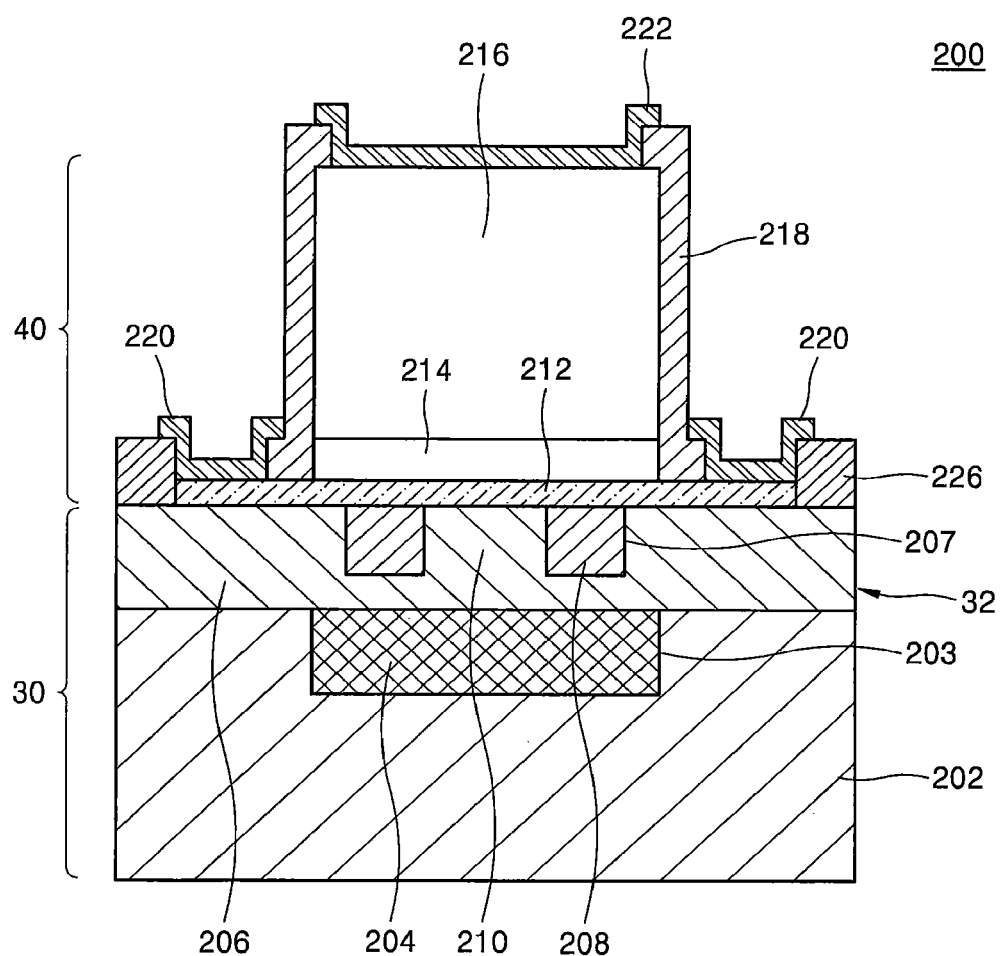
FIG. 6 is a cross-section of a hybrid silicon laser according to some embodiments of the present inventive concept.

Referring now to FIG. 6, a cross-section of a hybrid silicon laser 200 according to some embodiments of the present inventive concept. As illustrated in FIG. 6, the hybrid silicon laser 200 may be embodied on a bulk silicon substrate 202 rather than a SOI substrate. The bulk silicon substrate 202 may be a single-crystal silicon substrate. The hybrid silicon laser 200 may include a silicon optical waveguide structure 30 and a lasing structure 40.

The silicon optical waveguide structure 30 may include a localized insulating layer 204 formed in a partial area of the bulk silicon substrate 202 and an optical waveguide structure 32 formed on an upper portion of the on the localized insulating layer 204 and including an optical guide 210 of the silicon layer 206. The lasing structure 40 may be provided on the optical waveguide structure 32. The lasing structure 40 may include a light emitting layer that emits light (lasing). The light emitted from the lasing structure 40 is optically connected to the optical guide 210 of the optical waveguide structure 32 so as to transmit light to the outside.

In particular, the hybrid silicon laser 200 may be provided on the bulk silicon substrate 202 where the localized insulating layer 204 is formed. The localized insulating layer 204 may be a buried insulating layer that is buried in a bulk trench 203 formed in the bulk silicon substrate 202. The localized insulating layer 204 may be formed in a partial area in the vicinity of a surface of the bulk silicon substrate 202. The localized insulating layer 204 may include, for example, a silicon oxide ($SiO_2$) layer, a silicon oxynitride (SiON) layer, a silicon nitride (SiN) layer, and the like.

The optical waveguide structure 32 may include the silicon layer 206 formed on the bulk silicon substrate 202 and the localized insulating layer 204, an optical guide layer 208 formed in the silicon layer 206, and the optical waveguide 210 defined by the optical guide layer 208. The optical guide layer 208 may be provided in a multiple number to be separated from each other in vicinity of a surface of the silicon layer 206. The optical guide layer 208 may be formed inside the lasing structure 40. The optical guide layer 208 is formed above the localized insulating layer 204, not being extended over the opposite side walls of the localized insulating layer 204.

The optical guide 210 may be formed as the silicon layer 206. The silicon layer 206 may be formed above the localized insulating layer 204. The optical guide 210 that is defined by the optical guide layer 208 may be located above the localized insulating layer 204. The silicon layer 206 may be a crystallized silicon layer. The silicon layer 206 may be an impurity-doped crystallized silicon layer. The silicon layer 206 may be a single-crystal silicon layer.

The silicon layer 206 may be formed by forming an amorphous silicon layer on the bulk silicon substrate 202 and the localized insulating layer 204 and crystallizing the amorphous silicon layer, as discussed below. The crystallization of the amorphous silicon layer will be discussed further below.

The optical waveguide 210 may be surrounded by the optical guide layer 208 that is formed at the opposite sides of the optical guide 210 and each have a refractive index lower than that of a material forming the optical guide 210, for example, the silicon layer 206. The optical guide 210 illustrated in FIG. 6 may be, for example, a rib waveguide. In some embodiments, the optical guide 210 may include a stripe waveguide or a circular waveguide.

The optical guide layer 208 may be formed in a trench 207 formed in the silicon layer 206 with respect to the optical guide 210. When the optical guide layer 208 is formed as an empty space, the optical guide layer 208 may be a gas layer. The gas layer may be comprised of air or an inert gas such as argon or nitrogen. When the optical guide layer 208 is formed as a material layer filling the trench 207, the material layer may be, for example, a silicon oxide layer, a silicon nitride layer, a silicon oxynitride layer, a polymer layer, or a spin-on-glass layer.

The lasing structure 40 may include a Group III-V semiconductor gain layer coupled to the optical waveguide structure 32, a Group III-V semiconductor gain layer or Group III-V semiconductor crystalline layer, which is crystal-grown on the optical waveguide structure 32. The lasing structure 40 may be formed in a mesa type structure.

The lasing structure 40 may include a light-emitting composite layer 214, a clad layer 216 formed on the light-emitting composite layer 214, and a second electric terminal 222 formed on the clad layer 216. The light-emitting composite layer 214 may include a light emitting layer (active layer) that may emit light in response to an electric energy input. The light emitted from light-emitting composite layer 214, that is, the light emitting layer, may be optically connected to the optical guide 210 of the optical waveguide structure 32. The structure of the light-emitting composite layer 214 will be discussed further below.

A first electric connection layer 212 may be formed on the optical waveguide structure 32 as the lasing structure 40. The first electric connection layer 212 may be used to electrically connect a first electric terminal 220 to the light-emitting composite layer 214. The hybrid silicon laser 200 may have a structure to supply current to the first electric terminal 220 and the second electric terminal 222. The first electric terminal 220 may be insulated by a side wall insulting layer 218 and a surface insulating layer 226 formed on the silicon layer 206. The first electric terminal 220 may be configured as a minus terminal and the second electric terminal 222 may be configured as a plus terminal. The current may flow from the second electric terminal 222 to the first electric terminal 220 through the light-emitting composite layer 214.

The first electric connection layer 212 may be n-InP. The n-InP may be silicon-doped InP. In some embodiments, the first electric connection layer 212 may include, for example, a doping layer including elements in III and V groups of the periodic table. The first electric terminal 220 and the second electric terminal 222 may be formed of metal, for example, Au, Pt, Cu, and/or Al.

The clad layer 216 may be formed of p-InP and may include a plurality of material layers. The clad layer 216 may be Zn-doped InP. The side wall insulating layer 218 that restricts a current path through the clad layer 216 between the light-emitting composite layer 214 and the second electric terminal 222 may be formed on the opposite side walls of the clad layer 216. The side wall insulating layer 218 may be air, a silicon oxide layer, a silicon oxynitride layer, a silicon nitride layer, a polymer layer, or a spin-on-glass layer.

Figure 7:
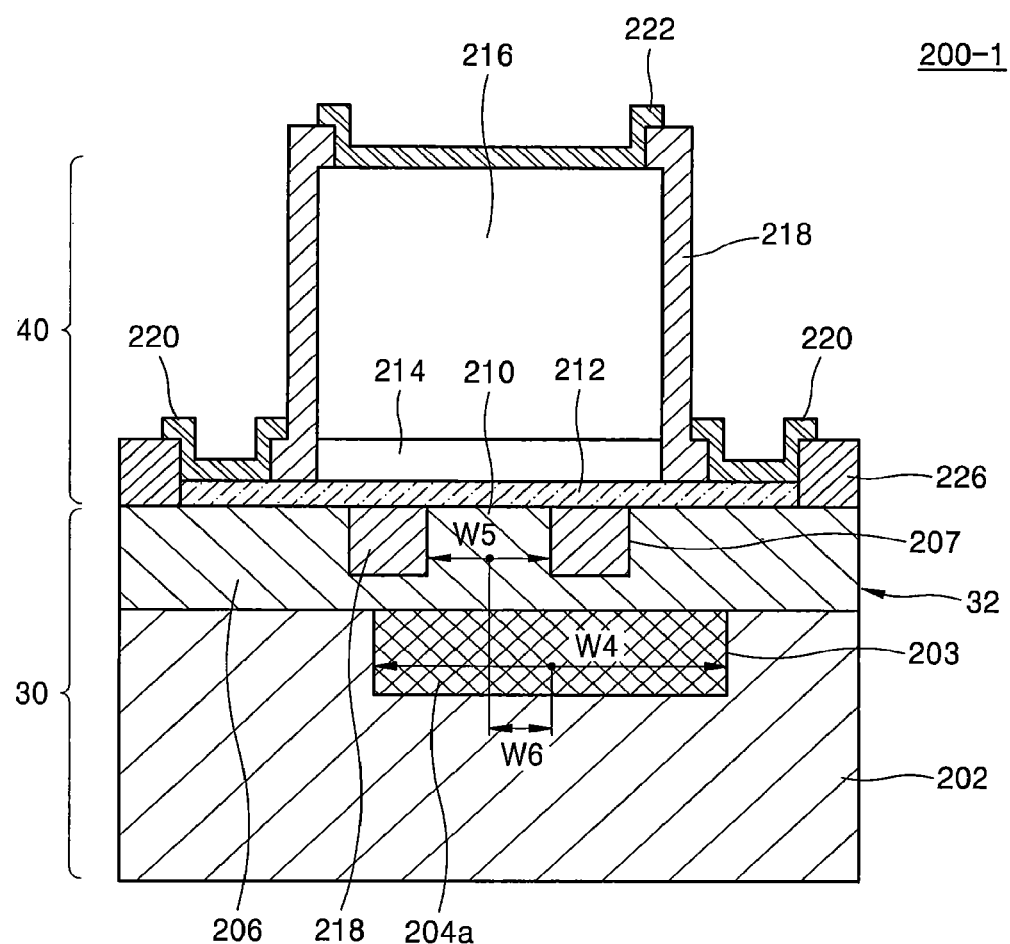
FIG. 7 is a cross-section of a hybrid silicon laser according to some embodiments of the present inventive concept.

Referring now to FIG. 7, a cross-section of a hybrid silicon laser 200-1 according to some embodiments of the present inventive concept will be discussed. In particular, the hybrid silicon laser 200-1 of FIG. 7 may be substantially the same as the hybrid silicon laser 200 of FIG. 6, except for the position where a localized insulating layer 404a is formed. Accordingly, details with respect to common structures will not be repeated herein in the interest of brevity.

The hybrid silicon laser 200-1 may include the localized insulating layer 204a formed in a bulk trench 203 of the bulk silicon substrate 202. The localized insulating layer 204a may have a width W4. The localized insulating layer 204a may be located under the optical guide 210 and may be configured in a variety of sizes. The width W4 of the localized insulating layer 204a of FIG. 7 may be larger than that of the localized insulating layer 204 of FIG. 6.

The silicon layer 206 may be formed on the bulk silicon substrate 202 and the localized insulating layer 204a. The optical guide layer 208 may be formed in the silicon layer 206. The optical guide 210 may be defined by the optical guide layer 208. The optical guide 210 that is defined by the optical guide layer 208 may be located above the localized insulating layer 204a.

A center point of a section of the optical guide 210 may be deviated by a distance W6 from a center point of a section of the localized insulating layer 204a. In the illustrated configuration, the likelihood that a crystal defect that may be generated in the silicon layer 206 located above the center point of the localized insulating layer 204a, during a process of manufacturing the silicon layer 206, may be reduced or possibly be avoided.

Figure 8:
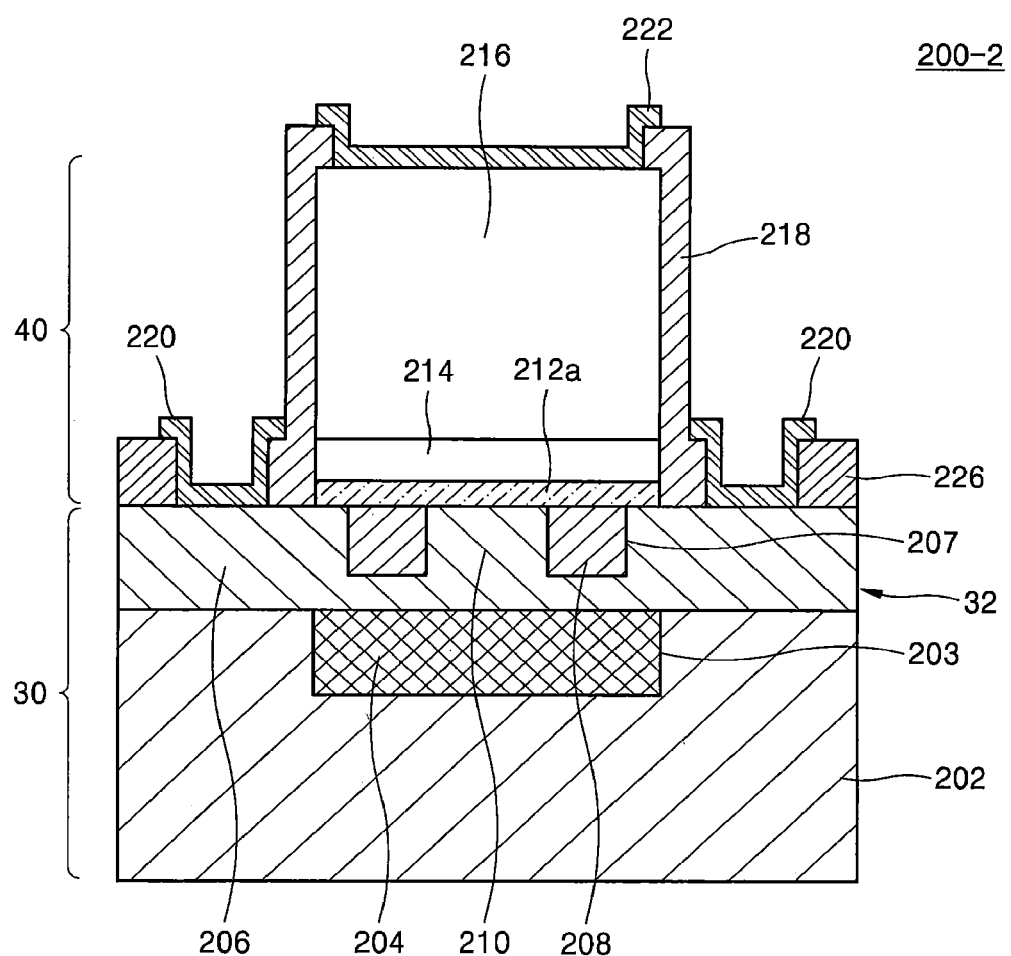
FIG. 8 is a cross-section of a hybrid silicon laser according to some embodiments of the present inventive concept.

Referring now to FIG. 8, a cross-section of a hybrid silicon laser 200-2 according to some embodiments of the present inventive concept will be discussed. In particular, the hybrid silicon laser 200-2 of FIG. 8 may be substantially the same as the hybrid silicon lasers 20 and 200-1 of FIGS. 6 and 7, except for the position where the first electric connection layer 212a is formed. Accordingly, details with respect to common structures will not be repeated herein in the interest of brevity.

The hybrid silicon laser 200-2 may include the optical waveguide structure 32 including the silicon layer 206. The silicon layer 206 may be an impurity doped crystalline silicon layer.

In the hybrid silicon laser 200-2, the first electric connection layer 212a may be formed only on an upper portion of the optical waveguide structure 32 and a lower portion of the light-emitting composite layer 214. The first electric connection layer 212a may not be formed on the silicon layer 206 outside the lasing structure 40. The first electric connection layer 212a may not be extended from the opposite sides of the light-emitting composite layer 214 and the clad layer 216 to be connected to the first electric terminal 220. The first electric terminal 220 may be formed directly on the silicon layer 206. The hybrid silicon laser 200-2 configured as above may be structurally simplified.

Figure 9:
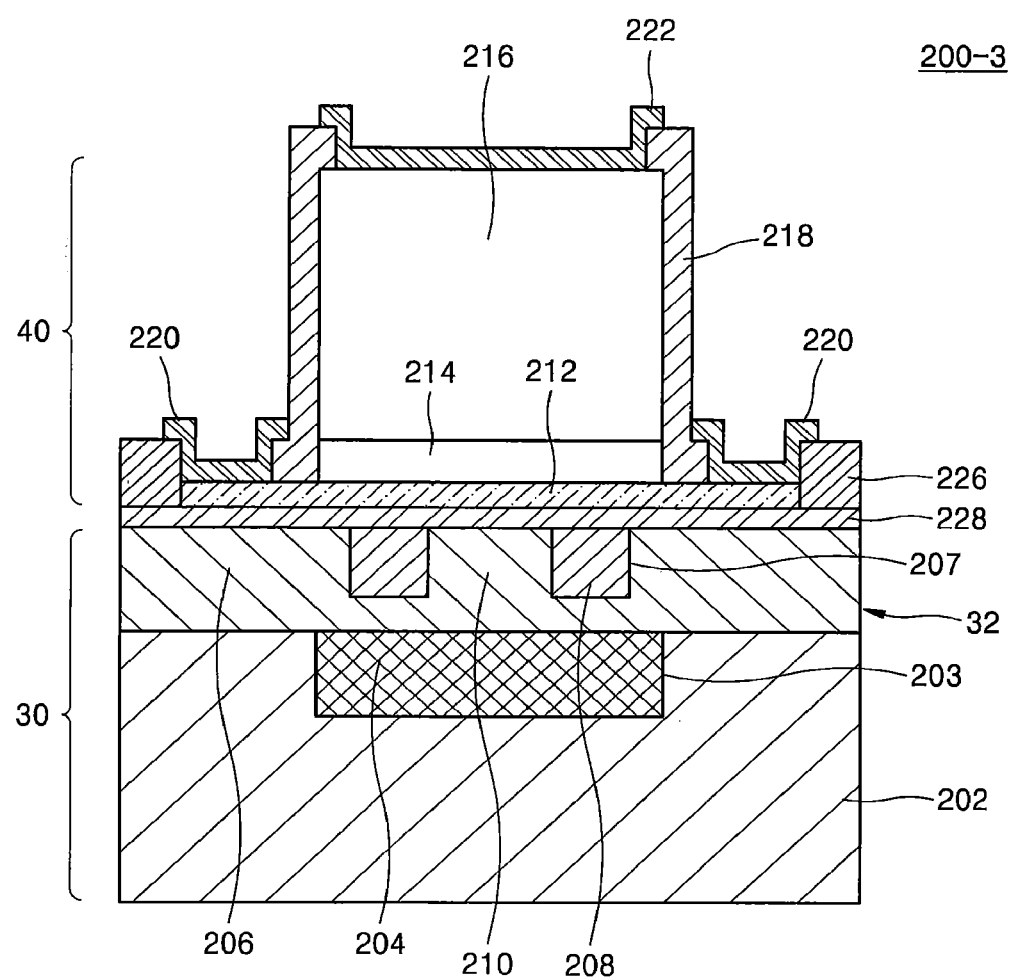
FIG. 9 is a cross-section of a hybrid silicon laser according to some embodiments of the present inventive concept.

Referring now to FIG. 9, a cross-section of a hybrid silicon laser 200-3 according to some embodiments of the present inventive concept will be discussed. In particular, the hybrid silicon laser 200-3 of FIG. 9 may be substantially the same as the hybrid silicon laser 200 of FIG. 6, except that an intermediate medium layer 228 is formed on the optical waveguide structure 32. Accordingly, details with respect to common structures will not be repeated herein in the interest of brevity.

In the hybrid silicon laser 200-3, the intermediate medium layer 228 may be formed on the optical waveguide structure 32. The intermediate medium layer 228 may be formed on the silicon layer 206 and the optical guide layer 208. The intermediate medium layer 228 may be a buffer layer for crystal growth to facilitate crystal growth on the optical waveguide structure 32. Furthermore, the intermediate medium layer 228 may be a combining medium layer for combining the lasing structure 40 and the optical waveguide structure 32, which is provided between the lasing structure 40 and the optical waveguide structure 32.

In the hybrid silicon laser 200-3 configured as above, when the intermediate medium layer 228 is provided on the optical waveguide structure 32, the lasing structure 40 may be easily formed on the optical waveguide structure 32.

Figure 10:
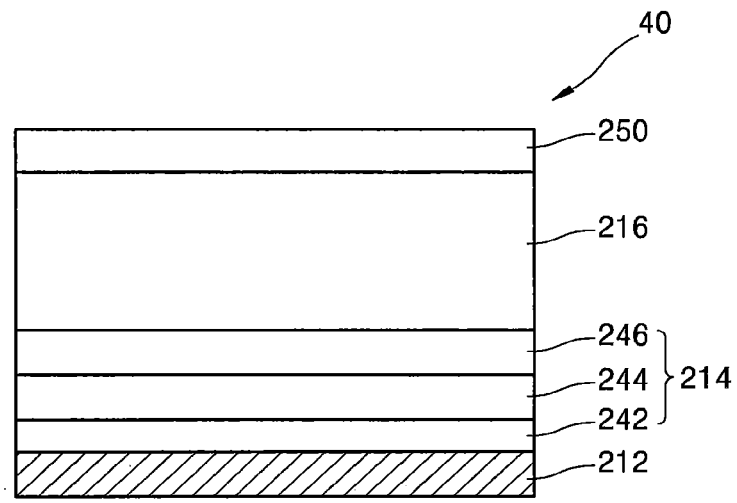
FIG. 10 is a cross-section illustrating an example of a lasing structure of FIGS. 6 to 9 according to some embodiments of the present inventive concept.

Referring to FIG. 10, a cross-section for explaining an example of the lasing structure of FIGS. 6 to 9 will be discussed. As illustrated in FIG. 10, the lasing structure 40 may include the first electric connection layer 212, the light-emitting composite layer 214, and the clad layer 216. A second electric connection layer 250 may be formed on the clad layer 216. The first electric connection layer 212 may be an n-InP layer.

The light-emitting composite layer 214 may include a light-emitting layer 244 and separate confinement heterostructure layers 242 and 246. The light-emitting layer 244 may be formed as an MQW formed of a Group III-V semiconductor material (a material including 3A group and 5A group elements of the periodic table), such as AlGaInAs, InAlGaAs, GaAs/GaAlAs, and/or InGaAsP.

The separate confinement heterostructure layers 242 and 246 are layers formed of a material having a refractive index lower than that of the material of the light-emitting layer 242 formed as a quantum well. The separate confinement heterostructure layers 242 and 246 may be formed of a Group III-V material such as AlGaInAs, InGaAsP, and/or GaAs. The separate confinement heterostructure layers 242 and 246 may be formed of the same material or different materials. The separate confinement heterostructure layers 242 and 246 may be a p-type layer. The clad layer 216 may be a p-InP layer, and the second electric connection layer 250 may be a p-type InGaAs layer.

Figure 11:
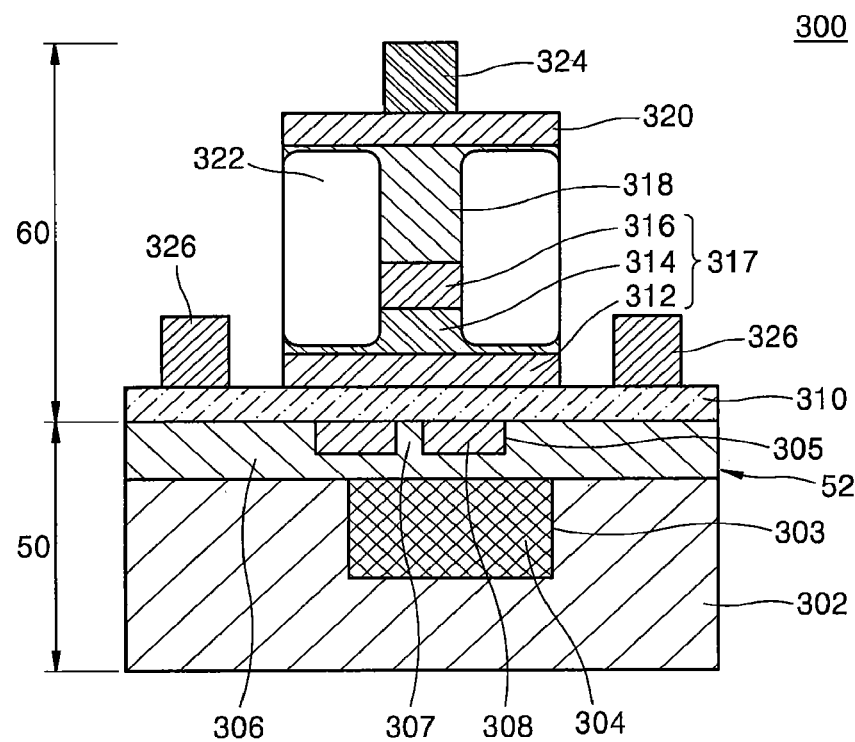
FIG. 11 is a cross-section of a hybrid silicon laser according to some embodiments of the present inventive concept.

Referring now to FIG. 11, a cross-section of a hybrid silicon laser 300 according to some embodiments of the present inventive concept will be discussed. In particular, the hybrid silicon laser 300 may be embodied on a bulk silicon substrate 302, not on an SOI substrate. The bulk silicon substrate 302 may be a single-crystal silicon substrate. The hybrid silicon laser 300 may include a silicon optical waveguide structure 50 and a lasing structure 60.

The silicon optical waveguide structure 50 may include a localized insulating layer 304 formed in a partial area of the bulk silicon substrate 302 and an optical waveguide structure 52 formed on an upper portion of the on the localized insulating layer 304 and including an optical guide 307 of the silicon layer 306. The lasing structure 60 may be provided on the optical waveguide structure 52. The lasing structure 60 may include a light emitting layer that emits light (lasing). The light emitted from the lasing structure 60 is optically connected to the optical guide 307 of the optical waveguide structure 52 so as to transmit light to the outside.

In particular, the hybrid silicon laser 300 may be provided on the bulk silicon substrate 302 where the localized insulating layer 304 is formed. The localized insulating layer 304 may be a buried insulating layer that is buried in a bulk trench 503 formed in the bulk silicon substrate 302. The localized insulating layer 304 may be formed in a partial area in the vicinity of a surface of the bulk silicon substrate 302. The localized insulating layer 304 may be include, for example, a silicon oxide ($SiO_2$) layer, a silicon oxynitride (SiON) layer, a silicon nitride (SiN) layer, and the like.

The optical waveguide structure 52 may include the silicon layer 306 formed on the bulk silicon substrate 302 and the localized insulating layer 304, an optical guide layer 308 formed in the silicon layer 306, and the optical waveguide 307 defined by the optical guide layer 308. The optical guide layer 308 may be provided in a multiple number to be separated from each other in vicinity of a surface of the silicon layer 306. The optical guide layer 308 may be formed under the lasing structure 60.

The optical guide 307 may be formed as the silicon layer 306. The silicon layer 306 may be formed above the localized insulating layer 304. The optical waveguide 307 that is defined by the optical guide layer 308 may be located above the localized insulating layer 304. The optical guide 307 may arranged such that a center point of a section of the optical guide 307 is deviated from a center point of a section of the localized insulating layer 304. The silicon layer 306 may be a crystallized silicon layer. The silicon layer 306 may be an impurity-doped crystallized silicon layer. The silicon layer 306 may be a single-crystal silicon layer.

The silicon layer 306 may be formed by forming an amorphous silicon layer on the bulk silicon substrate 302 and the localized insulating layer 304 and crystallizing the amorphous silicon layer. The crystallization of the amorphous silicon layer is discussed below in detail.

The optical waveguide 307 may be surrounded by the optical guide layer 308 that is formed at the opposite sides of the optical waveguide 307 and each have a refractive index lower than that of a material forming the optical guide 307, for example, the silicon layer 306. The optical guide 307 illustrated in FIG. 11 may be a rib waveguide. The optical guide 307 may be formed as a stripe waveguide or a circular waveguide.

The optical guide layer 308 may be formed in a trench 305 formed in the silicon layer 306 with respect to the optical waveguide 307. When the optical guide layer 308 is formed as an empty space, the optical guide layer 308 may be a gas layer. The gas layer may be comprised of air or an inert gas such as argon or nitrogen. When the optical guide layer 308 is formed as a material layer filling the trench 305, the material layer may be a silicon oxide layer, a silicon nitride layer, a silicon oxynitride layer, a polymer layer, or a spin-on-glass layer.

The lasing structure 60 may include a Group semiconductor gain layer coupled to the optical waveguide structure 52, a Group III-V semiconductor gain layer or Group III-V semiconductor crystalline layer, which is crystal-grown on the optical waveguide structure 52. The lasing structure 60 may be formed in a, mesa type structure.

As illustrated, the lasing structure 60 may include a first electric connection layer 310, a light-emitting composite layer 317, a clad layer 318, and a second electric connection layer 320. The light-emitting composite layer 317 may emit light in response to an electric energy input. The light emitted from light-emitting composite layer 317 may be optically connected to the optical guide 307 of the optical waveguide structure 52.

The light-emitting composite layer 317 may include a light-emitting layer 314 and separate confinement heterostructure (SCH) layers 312 and 316 formed on upper and lower portions of the light-emitting layer 314. The light-emitting layer 314 may be configured as an MQW that is formed of Group III-V semiconductor materials such as AlGaInAs, InAlGaAs, GaAs/GaAlAs, and/or InGaAsP. The light-emitting layer 314 may be a quantum dot formed of GaAs, InAs, or InGaAs.

The separate confinement heterostructure layers 312 and 316 are layers formed of a material having a refractive index lower than that of the light-emitting layer 314. The separate confinement heterostructure layers 312 and 316 may be formed of Group III-V materials such as AlGaInAs, InGaAsP, and/or GaAs. The separate confinement heterostructure layers 312 and 316 may be n-type layers.

A first electric connection layer 310 may be used to electrically connect a first electric terminal 326 to the light-emitting composite layer 317. The hybrid silicon laser 300 may have a structure to supply current to the first electric terminal 326 and the second electric terminal 324. The first electric terminal 326 may be configured as a minus terminal and the second electric terminal 324 may be configured as a plus terminal.

The current may flow from the second electric terminal 324 to the first electric terminal 326 through the second electric connection layer 320, the clad layer 318, and the light-emitting composite layer 317. The second electric connection layer 320 may be a p-type layer, for example, a p-InP layer. The first electric connection layer 310 may be an n-type layer, for example, an n-InP layer. The first electric connection layer 312 and the second electric connection layer 320 may each include a doping layer including elements in III and V groups of the periodic table. The first electric terminal 326 and the second electric terminal 324 may be formed of metal, for example, Au, Pt, Cu, and/or Al.

The clad layer 316 may be formed of p-InP and may include a plurality of material layers. A current confinement impurity region 322 for confining injection of current may be formed in the light-emitting composite layer 317 and the clad layer 318. In particular, the current confinement impurity region 322 for confining injection of current into the light-emitting layer 314 may be formed in the separate confinement heterostructure layer 316 and the clad layer 318 on the light-emitting layer 314. The current confinement impurity region 322 may be an ion injection region into which protons, that is, electrons or neutrons, are injected. The current confinement impurity region 322 may further facilitate emission of light from the light-emitting layer 314.

Figure 12:
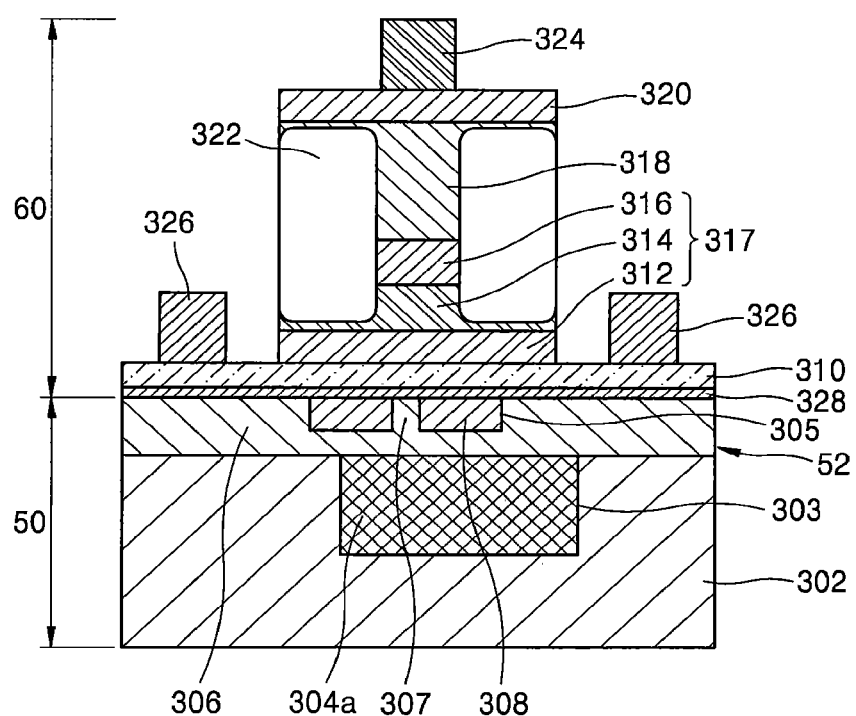
FIG. 12 is a cross-section of a hybrid silicon laser according to some embodiments of the present inventive concept.

Referring now to FIG. 12, a cross-section of a hybrid silicon laser 300-1 according to some embodiments of the present inventive concept will be discussed. In particular, the hybrid silicon laser 300-1 of FIG. 12 is substantially the same as the hybrid silicon laser 300 of FIG. 11, except that an intermediate medium layer 328 is formed on the optical waveguide structure 52. Accordingly, details with respect to common structures will not be repeated herein in the interest of brevity.

In the hybrid silicon laser 300-1, the intermediate medium layer 328 may be formed on the optical waveguide structure 52. The intermediate medium layer 328 may be formed on the silicon layer 306 and the optical guide layer 308. The intermediate medium layer 328 may be a buffer layer for crystal growth to facilitate crystal growth on the optical waveguide structure 52. Furthermore, the intermediate medium layer 328 may be a combining medium layer for combining the lasing structure 60 and the optical waveguide structure 52, which is provided between the lasing structure 60 and the optical waveguide structure 52.

In the hybrid silicon laser 300-1 configured as above, when the intermediate medium layer 328 is provided on the optical waveguide structure 52, the lasing structure 60 may be formed on the optical waveguide structure 52.

Figure 13:
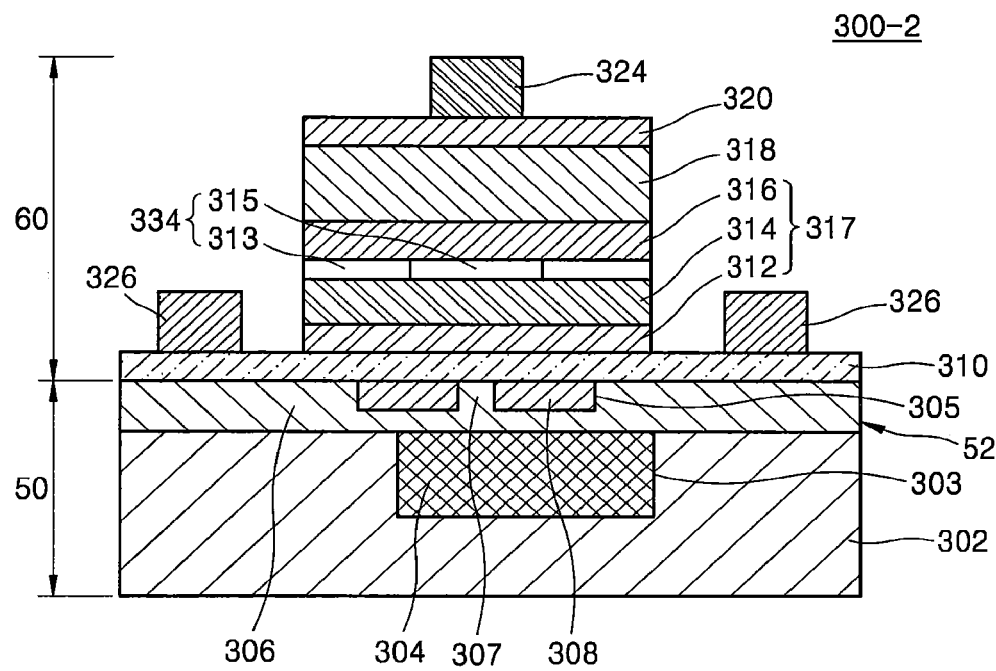
FIG. 13 is a cross-section of a hybrid silicon laser according to some embodiments of the present inventive concept.

Referring now to FIG. 13, a cross-section of a hybrid silicon laser 300-2 according to some embodiments of the present inventive concept will be discussed. In particular, the hybrid silicon laser 300-2 of FIG. 13 is substantially the same as the hybrid silicon laser 300 of FIG. 11, except that a current confinement layer 334 is formed. Accordingly, details with respect to common structures will not be repeated herein in the interest of brevity.

In the hybrid silicon laser 300-2, a current confinement layer 334 is formed in the light-emitting composite layer 317. In particular, the current confinement layer 334 for confining a flow of current into the light-emitting layer 314 may be formed between the light-emitting layer 314 and the separate confinement hetero structure layer 316 which form the light-emitting composite layer 317.

The current confinement layer 334 may include a metal layer 313 and a metal oxide layer 315. The metal layer 313 may be an aluminium layer. The metal oxide layer 315 may be an aluminium oxide layer obtained by oxidizing the metal layer 313, for example, an aluminium layer. In the hybrid silicon laser 300-2, the current confinement layer 334 may further facilitate the emission of light by the light-emitting layer 314.

Figure 14:
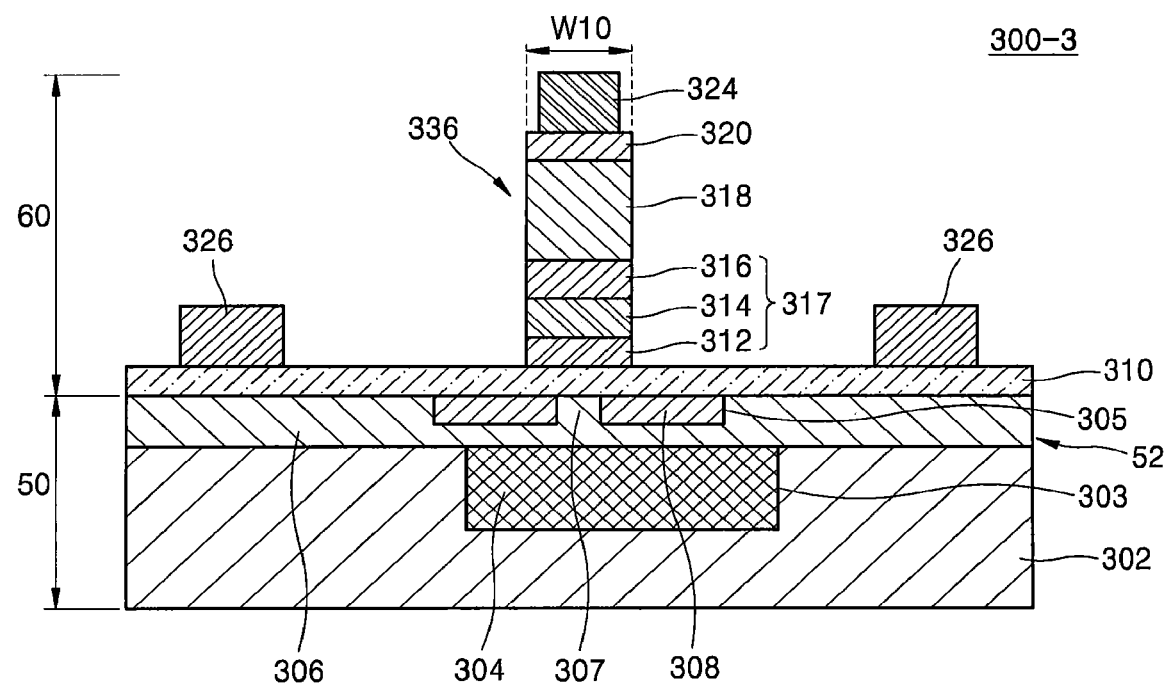
FIG. 14 is a cross-section of a hybrid silicon laser according to some embodiments of the present inventive concept.

Referring now to FIG. 14, a cross-section of a hybrid silicon laser 300-3 according to some embodiments of the present inventive concept will be discussed. In particular, the hybrid silicon laser 300-3 of FIG. 14 may be substantially the same as the hybrid silicon laser 300 of FIG. 11, except that a width W10 of the lasing structure 60 is formed narrow. Accordingly, details with respect to common structures will not be repeated herein in the interest of brevity.

In the hybrid silicon laser 300-3, the width W10 of the lasing structure 60 is narrower than that of the lasing structure 60 of FIG. 11. In the hybrid silicon laser 300-3, the lasing structure 60 is configured as a ridge type structure 336. In the hybrid silicon laser 300-3 configured as above, since current to the light-emitting layer 314 is confined due to the ridge type structure 336, the light-emitting layer 314 may further easily emit light.

Figure 15:
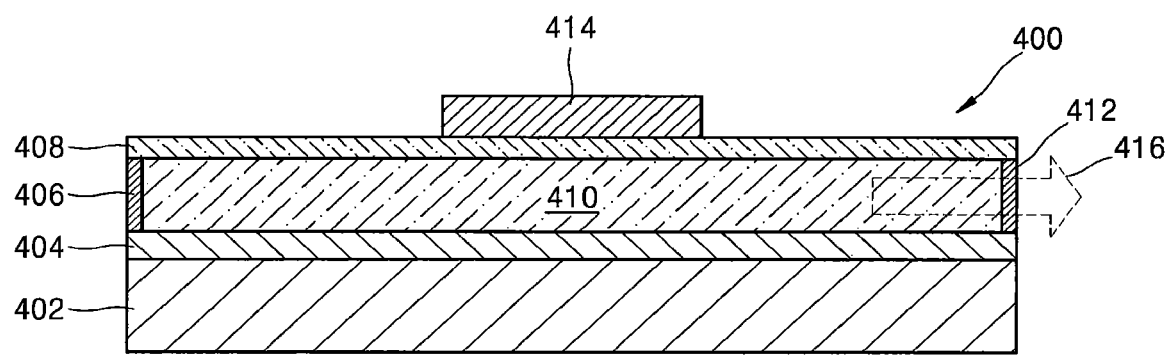
FIGS. 15 to 17 are cross-sections of an optical waveguide structure of the hybrid silicon laser according to some embodiments of the present inventive concept.
Figure 16:
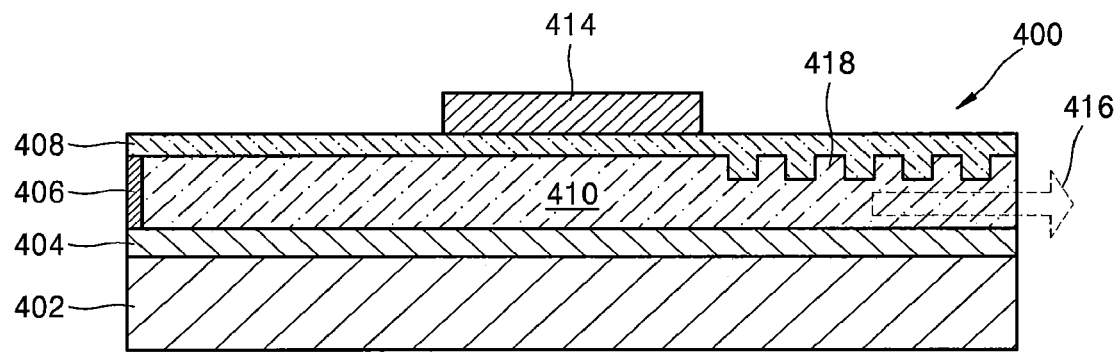
Figure 17:
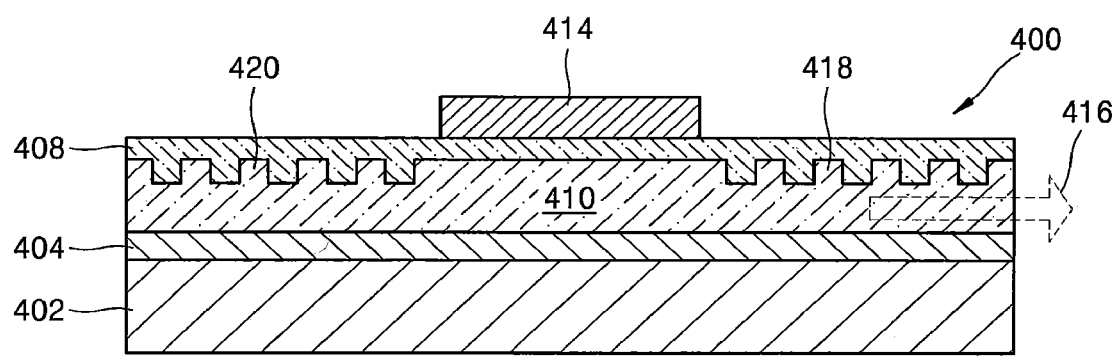

Referring now to FIGS. 15 to 17, cross-sections illustrating the optical waveguide structures 400 of the hybrid silicon lasers 100, 200, and 300 according to some embodiments of the present inventive concept will be discussed. In particular, FIGS. 15 to 17 illustrate the emission of light from the optical waveguide structures 12, 32, and 52 of the above-discussed hybrid silicon lasers 100, 200, and 300 of FIGS. 1, 6, and 11. In FIGS. 15 to 17, the optical waveguide structure is commonly indicated by a reference numeral "400". The optical waveguide structure 400 of FIGS. 15 to 17 may function as a laser cavity or an optical cavity. FIGS. 15 to 17 may be drawings obtained by rotating the sectional structures of FIGS. 1, 6, and 11 by 90° in a horizontal direction.

As illustrated in FIGS. 15 to 17, a localized insulating layer 404 is formed on a bulk silicon substrate 402. The bulk silicon substrate 402 may correspond to each of the bulk silicon substrates 102, 202, and 302 of FIGS. 1, 6, and 11. The localized insulating layer 404 may correspond to each of the localized insulating layers 104, 204, and 304 of FIGS. 1, 6, and 11.

An optical guide 410 is formed on the localized insulating layer 404. The optical guide 410 may correspond to each of the optical guides 110, 210, and 307 of FIGS. 1, 6, and 11. An electric connection layer 412 and a light-emitting composite layer 414 are formed on the optical guide 410. The electric connection layer 412 may correspond to each of the electric connection layers 112, 211, and 310 of FIGS. 1, 6, and 11. The light-emitting composite layer 414 may correspond to each of the light-emitting composite layers 114, 214, and 317 of FIGS. 1, 6, and 11.

As illustrated in FIG. 15, light reflection regions 406 and 412 where light is reflected may be provided at the opposite sides of the optical guide 410. The light reflection regions 406 and 412 may be formed by grinding a surface of the optical guide 410. The light reflection regions 406 and 412 may be formed by coating the surface of the optical guide 410 with a light reflection material. The light-emitting composite layer 414 is optically connected to the optical guide 410 and thus light 416 generated from the light-emitting composite layer 414 may enter the optical guide 410. The light 416 entering the optical guide 410 is partially output through the light reflection region 412 as indicated by an arrow.

The optical waveguide structure 400 of FIG. 16 is substantially the same as the optical waveguide structure 400 of FIG. 15, except that the light reflection region 412 is a lattice structure 418. Likewise, the optical waveguide structure 400 of FIG. 17 is substantially the same as the optical waveguide structure 400 of FIG. 15, except that the light reflection regions 406 and 412 are lattice structures 418 and 420.

Figure 18:
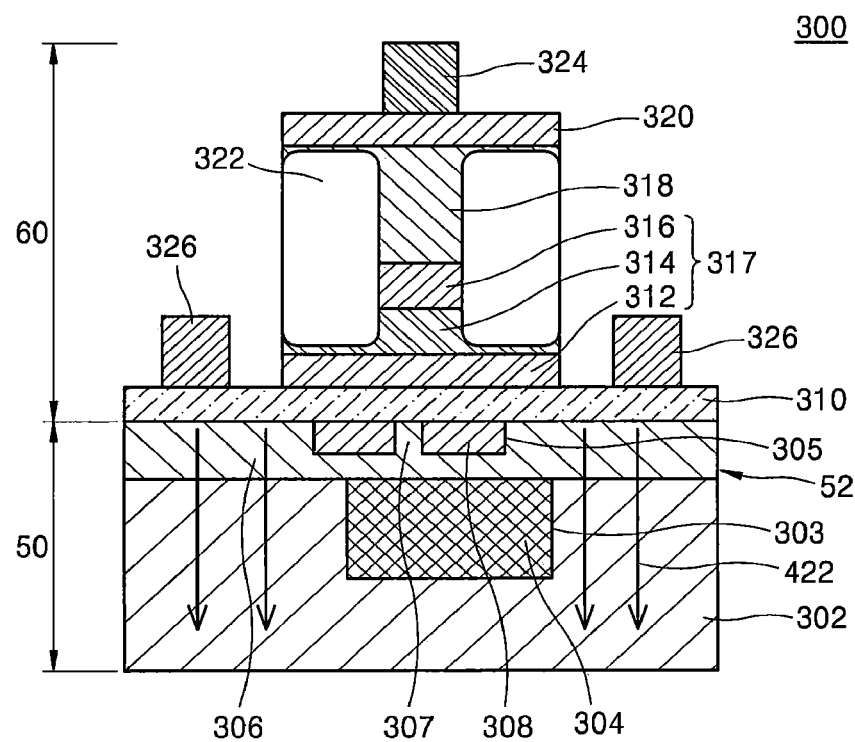
FIG. 18 is a cross-section for explaining heat dissipation of a hybrid silicon laser according to some embodiments of the present inventive concept.
Figure 19:
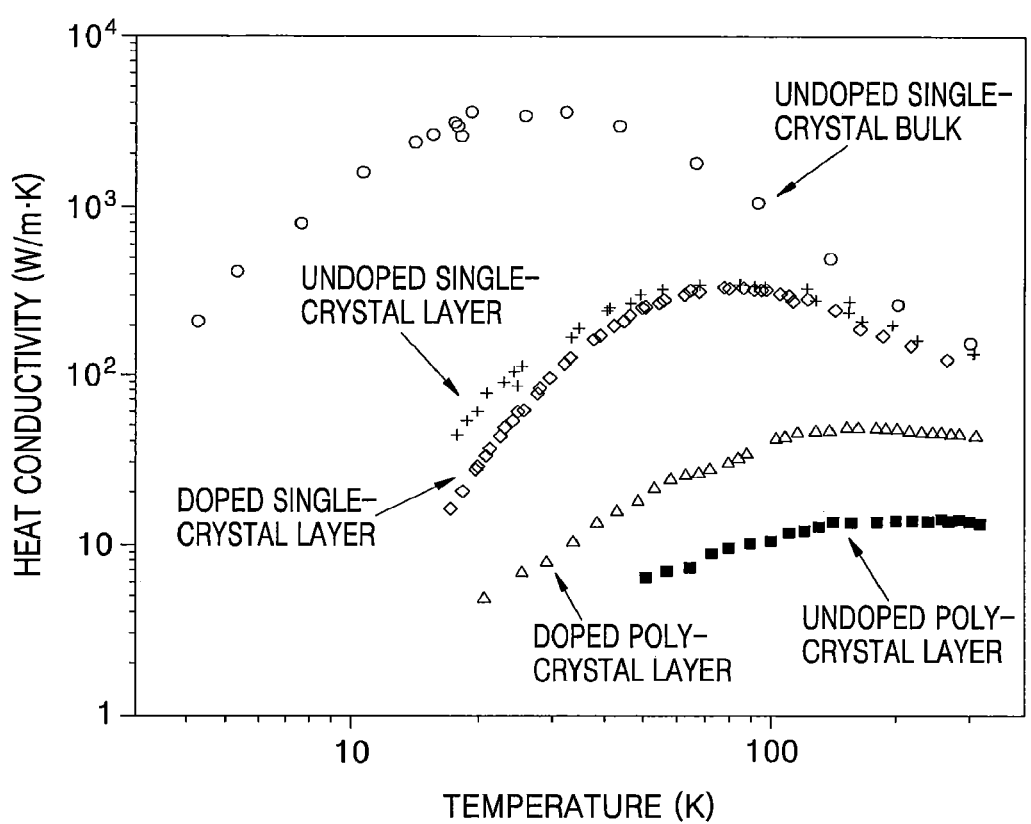
FIG. 19 is a plot illustrating heat conductivity of a bulk silicon substrate used for a hybrid silicon laser according to some embodiments of the present inventive concept.

FIG. 18 is a cross-section for explaining heat dissipation of the hybrid silicon laser 300 according to some embodiments of the present inventive concept. FIG. 19 is a plot for explaining heat conductivity of the bulk silicon substrate 302 used for the hybrid silicon laser 300 according to some embodiments of the present inventive concept. In particular, heat dissipation is discussed by using the hybrid silicon laser 300 of FIG. 11. In the hybrid silicon laser 300, a large amount of heat may be generated from the lasing structure 60. The heat generated as above may be output to the outside through the silicon layer 306 and the bulk silicon substrate 302, as indicated by arrows in FIG. 18.

In the hybrid silicon laser 300 of FIG. 11, while an insulating layer is not formed on an entire surface of the bulk silicon substrate 302, the localized insulating layer 304 is partially formed in bulk silicon substrate 302. Accordingly, the hybrid silicon laser 300 of FIG. 11 may easily transfer heat through the silicon layer 306 and the bulk silicon substrate 302.

As illustrated in FIG. 19, heat conductivity of the bulk silicon substrate 302, that is, an undoped single-crystal bulk, is improved. Furthermore, as illustrated in FIG. 19, it may be seen that heat conductivities of an undoped single-crystal layer and a doped single-crystal layer may be superior to those of an undoped polycrystal layer and a doped polycrystal layer. Accordingly, when the silicon layer 306 is formed as a single-crystal silicon layer as discussed herein, heat emission may be further facilitated.

Figure 20:
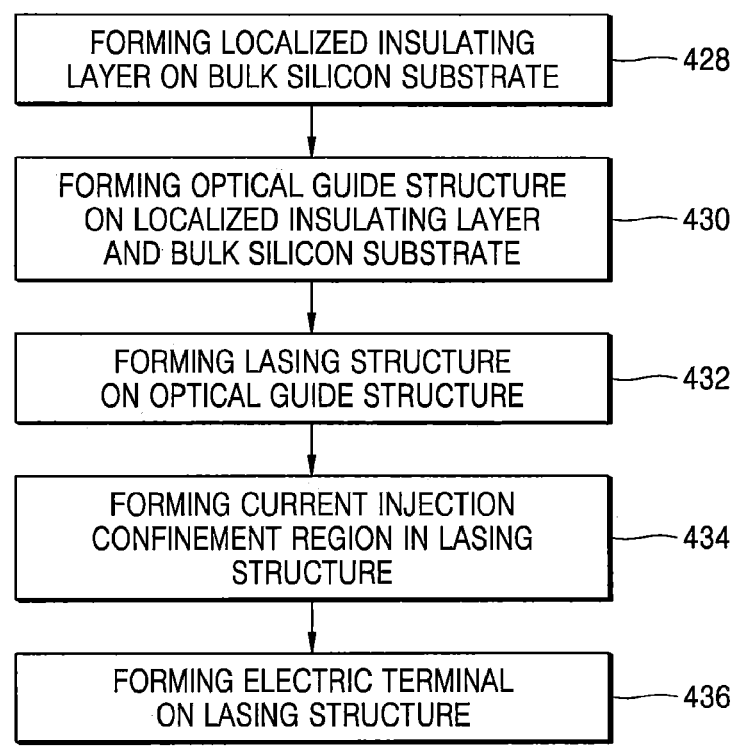
FIG. 20 is a flowchart illustrating processing steps in the fabrication of a hybrid silicon laser according to some embodiments of the present inventive concept.

Referring now to FIG. 20, a flowchart illustrating processing steps in the fabrication of hybrid silicon lasers according to some embodiments of the present inventive concept will be discussed. In particular, operations begin at block 428 by forming a localized insulating layer on a bulk silicon substrate. An optical waveguide structure is formed on the localized insulating layer and the bulk silicon substrate (Block 430).

A lasing structure is formed on the optical waveguide structure (Block 432) and a current injection confinement region is formed in the lasing structure (Block 434). An electric terminal is formed on the lasing structure (Block 436). The forming of a current confinement region in the lasing structure may be omitted in some embodiments. Details with respect to operations 428-436 will be discussed further below.

Figure 21A:
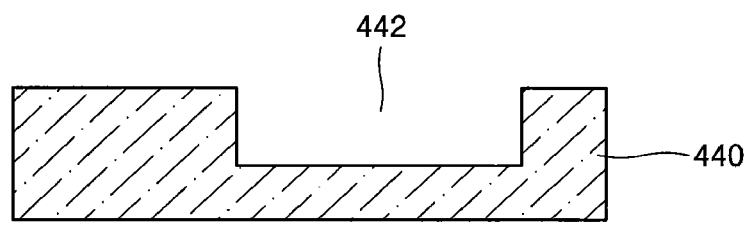
FIGS. 21A to 21G are cross-sections illustrating processing steps in the fabrication of a localized insulating layer and an optical waveguide structure of the hybrid silicon laser of FIG. 20.

Referring not FIGS. 21A to 21G, cross-sections processing steps in the fabrication of localized insulating layers and the optical waveguide structures of the hybrid silicon laser of FIG. 20 will be discussed. As illustrated in FIG. 21A, a bulk silicon substrate 440 is prepared. The bulk silicon substrate 440 may be a bulk silicon wafer. The bulk silicon substrate 440 may correspond to each of the bulk silicon substrates 102, 202, and 302 of FIGS. 1, 6, and 11. A bulk trench 442 is formed in a portion of the bulk silicon substrate 440 by selectively etching the bulk silicon substrate 440. The bulk trench 442 may be formed to a depth at which a laser beam is blocked so as not to pass downward through the bulk silicon substrate.

Figure 21B:
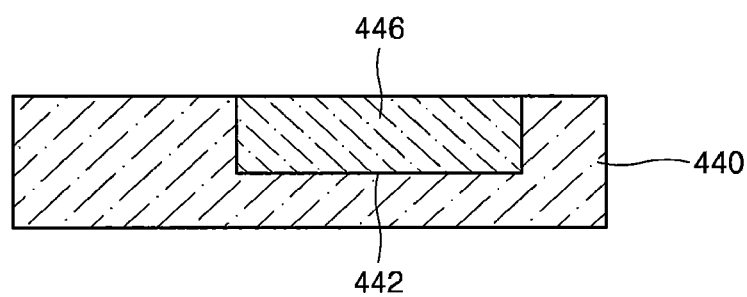

Referring to FIG. 21B, a localized insulating layer 446 is formed to fill the bulk trench 442. The localized insulating layer 446 may correspond to each of the localized insulating layers 104, 204, and 304 of FIGS. 1, 6, and 11. The localized insulating layer 446 may be formed as a material layer having a refractive index lower than that of a silicon layer forming an optical guide. The localized insulating layer 446 may be formed of a silicon oxide ($SiO_2$) layer, a silicon oxynitride (SiON) layer, or a silicon nitride (SiN) layer. The localized insulating layer 446 may be formed by forming an insulating material layer on an entire surface of the bulk silicon substrate 440, filling the bulk trench 442, and performing chemical/mechanical grinding on the insulating material layer.

Figure 21C:
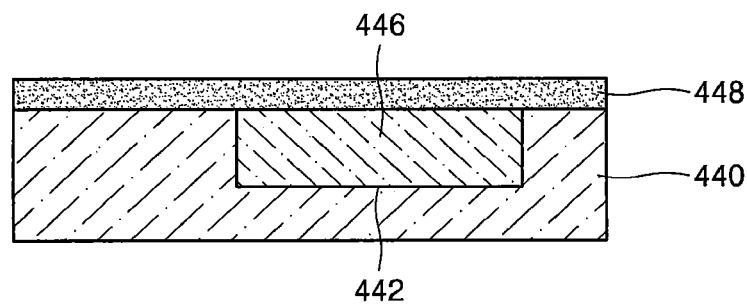

Referring to FIG. 21C, an amorphous silicon layer 448 is formed on entire surfaces of the localized insulating layer 446 and the bulk silicon substrate 440. The amorphous silicon layer 448 is formed on the localized insulating layer 446 and the bulk silicon substrate 440. The amorphous silicon layer 448 may be changed to a crystallized silicon layer to be used as the optical guide.

Figure 21D:
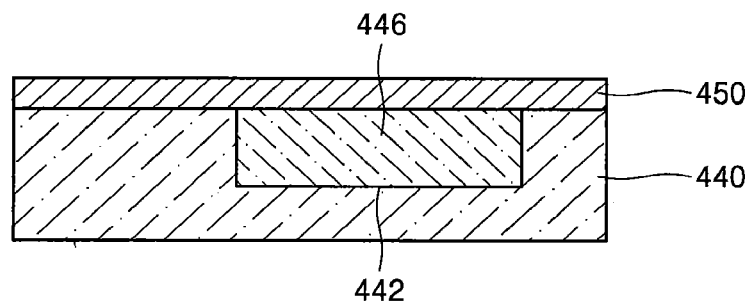

Referring to FIG. 21D, a crystallized silicon layer 450 is formed by crystallizing the amorphous silicon layer 448. The crystallized silicon layer 450 may correspond to each of the silicon layers 106, 206, and 306 of FIGS. 1, 6, and 11. The amorphous silicon layer 448 may be crystallized by a laser epitaxial growth (LEG) method, a solid phase epitaxy (SPE) method, an epitaxial lateral overgrowth (ELO)

method, a selective epitaxial growth (SEG) method, or a solid phase crystallization (SPC) method.

The amorphous silicon layer 448 is crystallized by applying energy, for example, heat energy or laser energy, to the amorphous silicon layer 448, thereby changing the amorphous silicon layer 448 to the crystallized silicon layer 450. The crystallized silicon layer 450 may be formed on the localized insulating layer 446 and the bulk silicon substrate 440. The crystallized silicon layer 450 may become the optical guide later through selective etching. The crystallized silicon layer 450 may be doped with impurities as necessary.

Figure 21E:
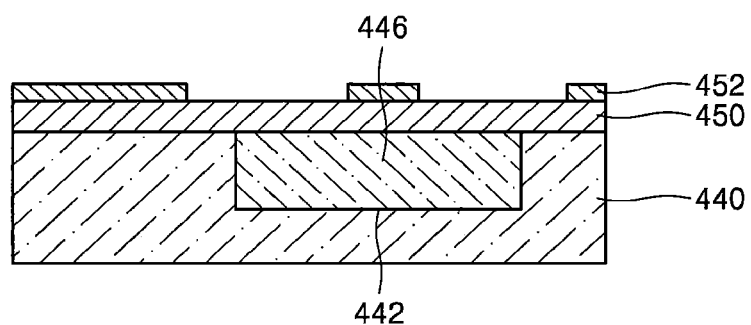

Referring to FIG. 21E, a mask pattern 452 is formed on the crystallized silicon layer 450. The mask pattern 452 is partially formed on upper surfaces of the localized insulating layer 446 and the bulk silicon substrate 440. The mask pattern 452 may be a soft mask pattern such as a photoresist pattern, or a hard mask pattern such as a silicon oxide layer or a silicon nitride layer. The mask pattern 452 exposes parts of a surface of the crystallized silicon layer 450.

Figure 21F:
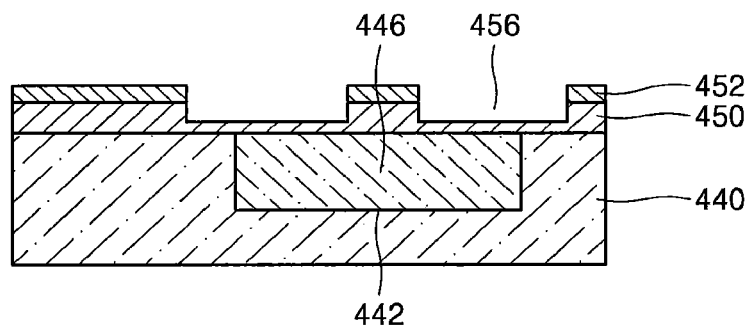
Figure 21G:
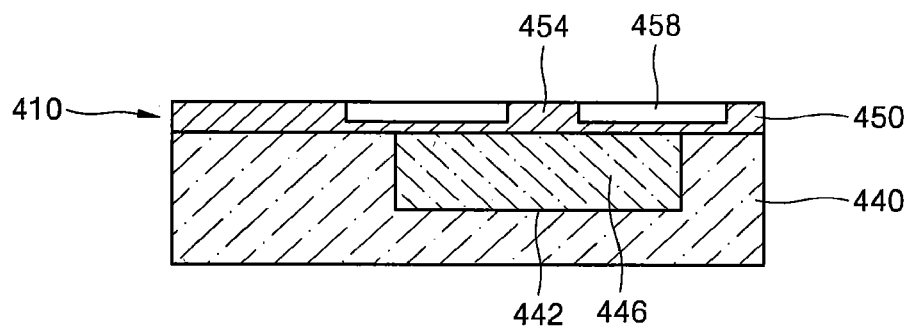

Referring to FIGS. 21F and 21G, a trench 456 is formed by selectively etching the crystallized silicon layer 450 by using the mask pattern 452 as an etch mask, as illustrated in FIG. 21F, and the mask pattern 452 is removed as illustrated in FIG. 21G.

As illustrated in FIG. 21G, the trench 456 may become an optical guide layer 458. The optical guide layer 458 may correspond to each of the optical guide layers 108, 208, and 308 of FIGS. 1, 6, and 11. When the optical guide layer 458 is configured as an empty space, the empty space may be a gas layer having a refractive index lower than that of the crystallized silicon layer 450. For example, the optical guide layer 458 may be an air layer or an inert gas layer. Furthermore, an optical guide 454 that is defined by the optical guide layer 458 may be formed.

As necessary, the trench 456 may be filled with a material layer having a refractive index lower than that of crystallized silicon layer 450. For example, the optical guide layer 458 may be a silicon oxide layer, a silicon nitride layer, a silicon oxynitride layer, a polymer layer, or a spin-on-glass layer. Through the above processes, the optical waveguide structure 410 including the crystallized silicon layer 450, the optical guide 454, and the optical guide layer 458 may be formed on the localized insulating layer 446 and the bulk silicon substrate 440.

Figure 22A:
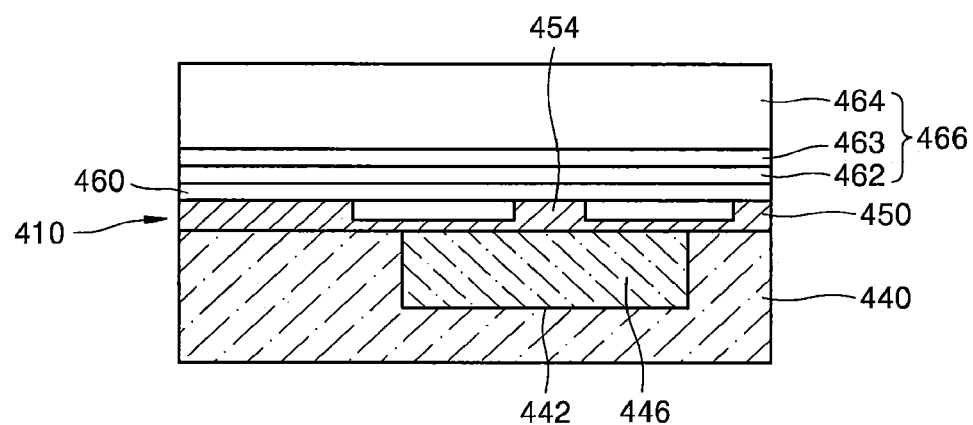
FIGS. 22A and 22B are cross-sections illustrating processing steps in the fabrication of a lasing structure of the hybrid silicon laser of FIG. 20.
Figure 22B:
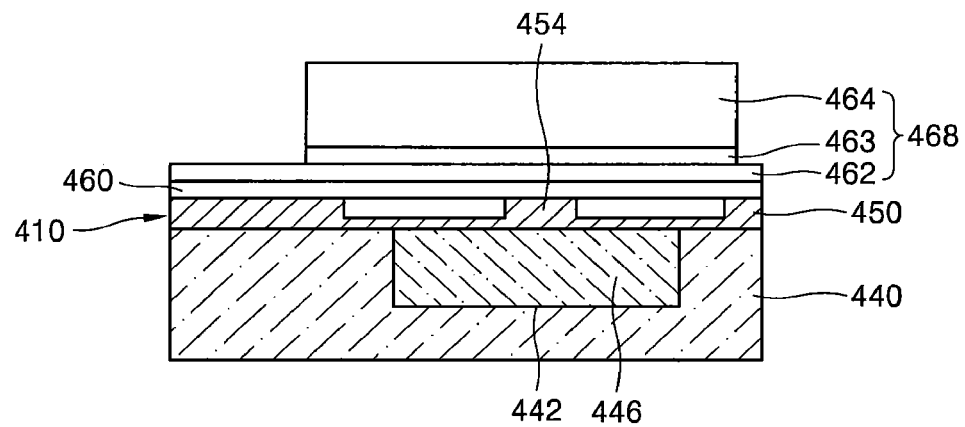

Referring now to FIGS. 22A and 22B, cross-sections illustrating processing steps in the fabrication of a lasing structure of the hybrid silicon laser of FIG. 20 will be discussed. Referring to FIG. 22A, as discussed above, the optical waveguide structure 410 may be formed on the localized insulating layer 446 and the bulk silicon substrate 440. The optical waveguide structure 410 may correspond to each of the optical waveguide structures 12, 32, and 52 of FIGS. 1, 6, and 11. An intermediate medium layer 460 is formed on the optical waveguide structure 410. The intermediate medium layer 460 may be a buffer layer for crystal growth to facilitate crystal growth on the optical waveguide structure 410.

A preliminary lasing structure 466 including an electric connection layer 462, a light-emitting composite layer 463, and a clad layer 464 is formed on the intermediate medium layer 460. The preliminary lasing structure 466 may be formed by crystal-growing a plurality of material layers on the intermediate medium layer 460.

Referring to FIG. 22B, a lasing structure 468 for exposing a partial surface of the electric connection layer 462 may be formed by etching the preliminary lasing structure 466. The lasing structure 468 may correspond to each of the lasing structure 20, 40, and 60 of FIGS. 1, 6, and 11. Accordingly, the lasing structure 468 may be a mesa type lasing structure. As necessary, a current confinement region may be formed in the lasing structure (Block 434). An electric terminal is formed on the electric connection layer 462, thereby completing the hybrid silicon laser.

Figure 23:
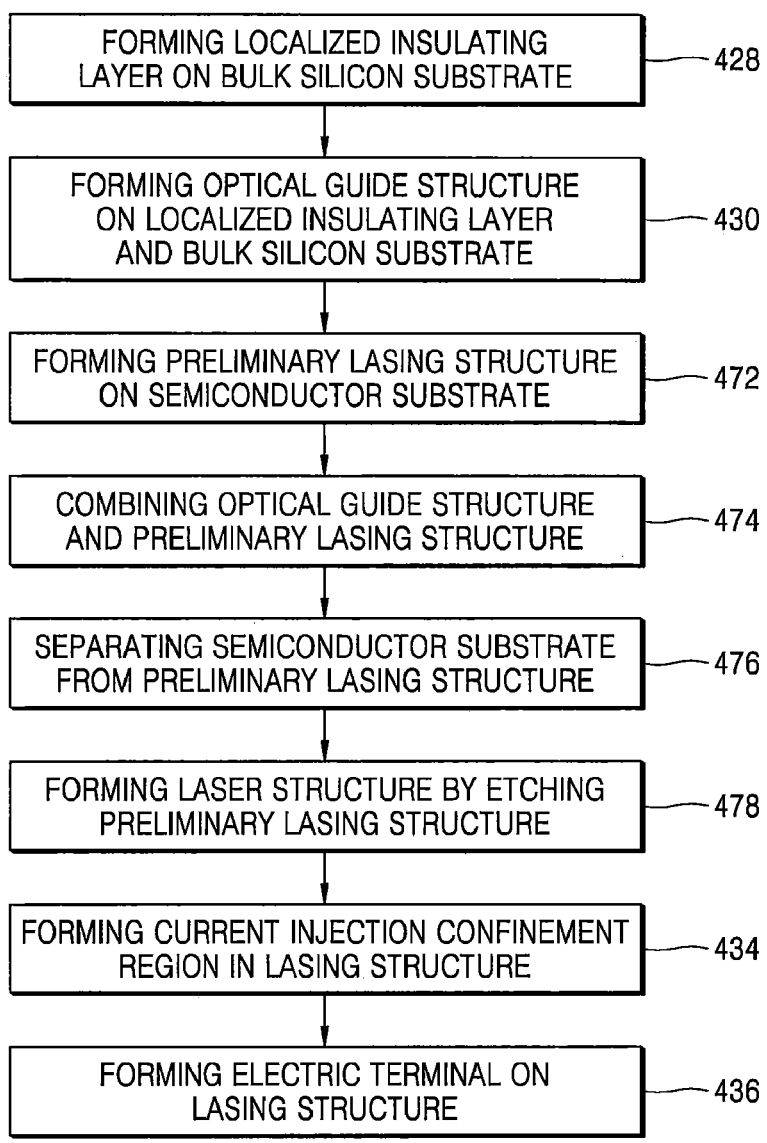
FIG. 23 is a flowchart illustrating processing steps in the fabrication of a hybrid silicon laser according to some embodiments of the present inventive concept.

Referring now to FIG. 23, a flowchart illustrating processing steps in the fabrication of a hybrid silicon laser according to some embodiments of the present inventive concept will be discussed.

In particular, operations begin at block 428 by forming a localized insulating layer on a bulk silicon substrate and forming an optical waveguide structure on the localized insulating layer and the bulk silicon substrate (Block 430). Since the forming of the localized insulating layer and the forming of the optical waveguide structure are the same as those discussed with reference to FIG. 21, detailed descriptions thereof are omitted.

The method may further include forming a preliminary lasing structure on a semiconductor substrate, for example, a GaAS substrate (Block 472), combining the optical waveguide structure formed on the bulk silicon substrate and the preliminary lasing structure formed on the semiconductor substrate (Block 474), separating the semiconductor substrate from the preliminary lasing structure (Block 476), and forming a lasing structure by etching the preliminary lasing structure (Block 478).

Furthermore, the hybrid silicon laser manufacturing method may further include forming a current injection confinement region in the lasing structure (Block 434) and forming an electric terminal on the lasing structure (Block 436). The forming of the current injection confinement region in the lasing structure may be omitted in some embodiments.

Figure 24A:
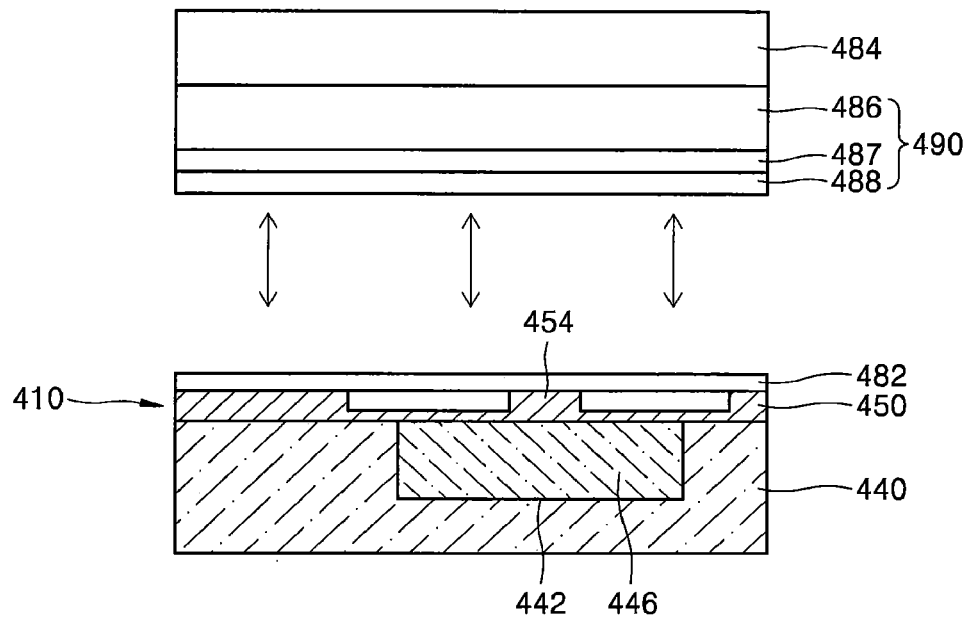
FIGS. 24A to 24C are cross-sections illustrating processing steps in the fabrication of a lasing structure of the hybrid silicon laser of FIG. 23.
Figure 24B:
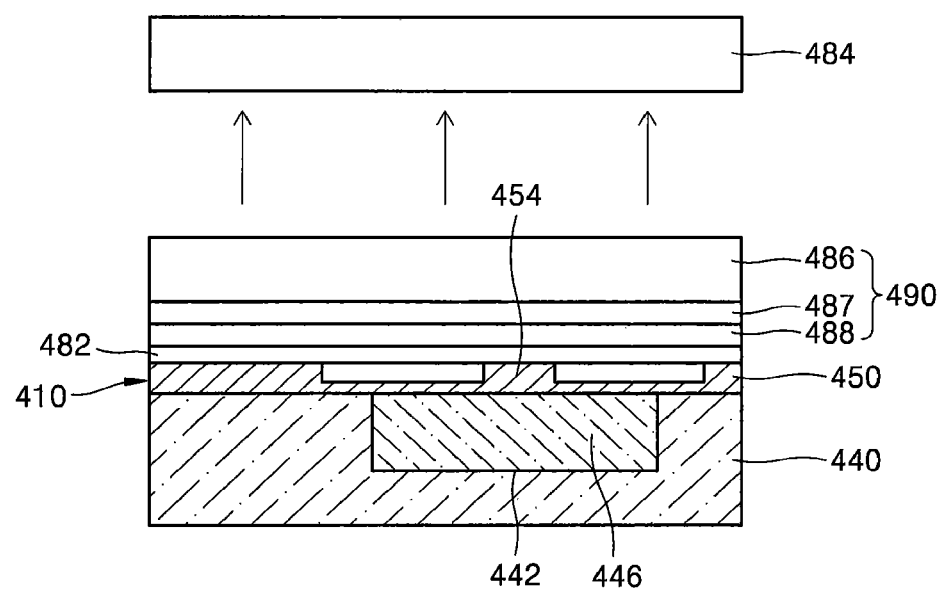
Figure 24C:
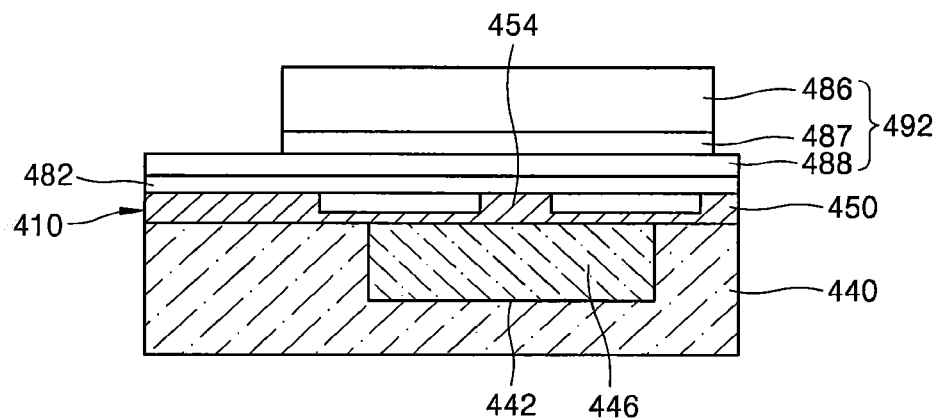

Referring now to FIGS. 24A to 24C, cross-sections illustrating processing steps in the fabrication of a lasing structure of the hybrid silicon laser of FIG. 23 will be discussed. Referring to FIG. 24A, as discussed above in Block 472, a preliminary lasing structure 490 including a clad layer 486, a light-emitting composite layer 487, and an electric connection layer 486 is formed on a semiconductor substrate 484. The preliminary lasing structure 490 may be formed by crystal-growing a plurality of material layers on the semiconductor substrate 484.

As discussed above, the optical waveguide structure 410 is formed on the localized insulating layer 446 and the bulk silicon substrate 440. An intermediate medium layer 482 is formed on the optical waveguide structure 41'0. The intermediate medium layer 460 may be a combining medium layer for combining the optical waveguide structure 410 and an electric connection layer of the lasing structure which is discussed further below. In some embodiments, the intermediate medium layer 460 may not be formed.

Referring now to FIG. 24B, as discussed above in Block 474, the preliminary lasing structure 490 on the semiconductor substrate 484 and the optical waveguide structure 410 of the bulk silicon substrate 440 are combined to each other by using the intermediate medium layer 482. The combining process may be a process of combining the preliminary lasing structure 490 and the optical waveguide structure 410 by applying heat to the semiconductor substrate 484 and the bulk silicon substrate 440.

As discussed above in Block 476, the semiconductor substrate 484 is separated from the preliminary lasing structure 490. Only the preliminary lasing structure 490 is left on the bulk silicon substrate 440 where the optical waveguide structure 410 is formed.

Referring to FIG. 24C, a lasing structure 492 for exposing a partial surface of an electric connection layer 488 is formed by etching the preliminary lasing structure 490. Accordingly, the lasing structure 492 may be a mesa type lasing structure. The lasing structure 492 may correspond to each of the lasing structures 20, 40, and 60 of FIGS. 1, 6, and 11.

In some embodiments, a current confinement region may be formed in the lasing structure 468 (Block 434). Next, a hybrid silicon laser may be completed by forming an electric terminal on the electric connection layer 462.

A variety of optical systems using the hybrid silicon laser according to some embodiments of the present inventive concept will be discussed.

Figure 25:
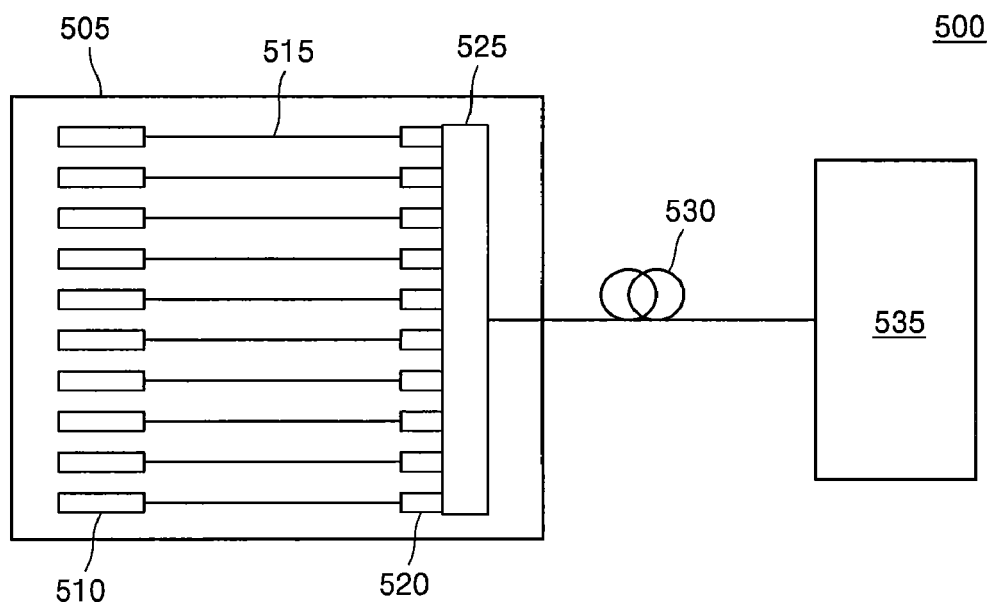
FIG. 25 is a block diagram illustrating an optical system using a hybrid silicon laser according to some embodiments of the present inventive concept.

Referring now to FIG. 25, a block diagram illustrating some embodiments of an optical system using a hybrid silicon laser according to the present inventive concept will be discussed. In particular, an optical system 500 may be used to optically transmit data. The optical system 500 may include an optical integrated circuit 505, waveguides 515 and 530, and an optical receiver 535. The optical integrated circuit 505 may include the hybrid silicon laser 510 according to some embodiments. The hybrid silicon laser 510 may correspond to each of the hybrid silicon lasers 100, 200, and 300 of FIGS. 1, 6, and 11. The optical integrated circuit 505 may include a plurality of the hybrid silicon lasers 510. All or some of the optical integrated circuit 505, the waveguides 515 and 530, and the optical receiver 535 may be integrated on a single substrate.

The hybrid silicon laser 510 may be optically connected to an optical modulator 520 that encodes information through the waveguide 515. Light output from the hybrid silicon laser 510 may be transferred to the optical modulator 520 and a multiplexer 525, via the waveguide 515. The waveguide 530 may be a single fiber. The optical receiver 535 may receive the light output from the waveguide 530 via the multiplexer 525.

The optical receiver 535 may include a demultiplexer that divides an input light signal from the waveguide 530 to a wavelength of a component for carrying information, a plurality of waveguides that are optically connected to the demultiplexer, and a plurality of detectors that are optically connected to the waveguides of the optical receiver 535 and detect light from the waveguides.

Figure 26:
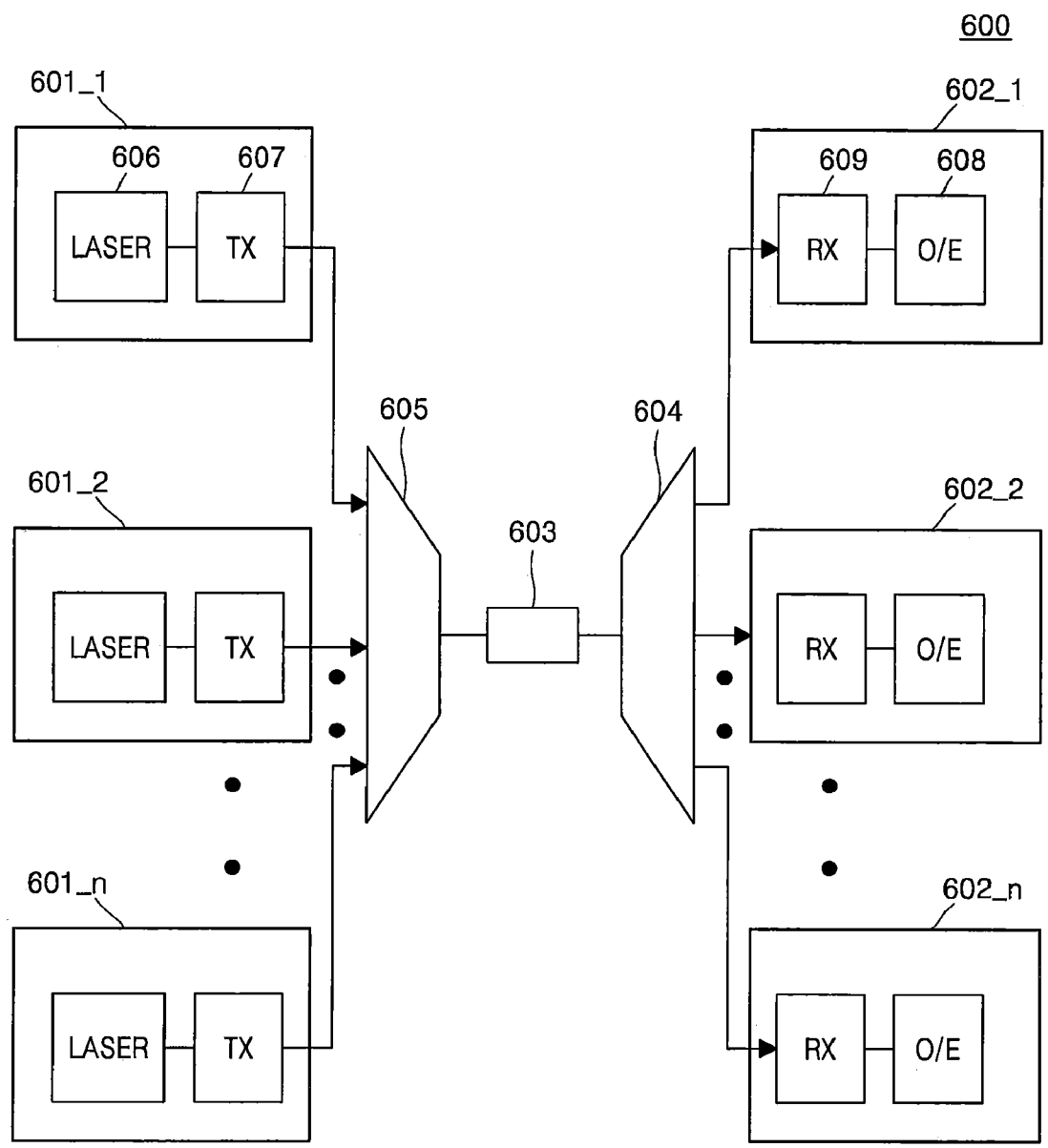
FIG. 26 is a block diagram illustrating an optical system using a hybrid silicon laser according to some embodiments of the present inventive concept.

Referring now to FIG. 26, a block diagram illustrating some embodiments of an optical system 600 using a hybrid silicon laser according to the present inventive concept will be discussed. In particular, the optical system 600 may include a plurality of optical transmitters 601_1 to 601_*n*, a multiplexer 605, an optical waveguide 603, a demultiplexer 604, and a plurality of optical receivers 602_1 to 602_*n*. The optical waveguide 603 may be an optical fiber or an optical universal bus.

Each of the optical transmitters 601_1 to 601_*n* may include a hybrid silicon laser 606 according to some embodiments of the present inventive concept, and a transmitter TX 607. The hybrid silicon laser 606 may correspond to each of the hybrid silicon laser 100, 200, and 300 of FIGS. 1, 6, and 11. The hybrid silicon laser 606 may be optically connected to the transmitter TX 607. The transmitter TX 607 may transmit a light signal of a different wavelength via the multiplexer 605, the optical waveguide 603, and the demultiplexer 604. The wavelength of a light signal may be about 900 nm, or 1260 nm to 1380 nm. The transmitter 607 may be an optical modulator.

Each of the optical receivers 602_1 to 602_*n* may include a receiver RX 609 and an optoelectronic converter O/E 608. The receiver RX 609 and the optoelectronic converter 608 may be optically connected to each other. The receiver RX 609 may be a photodetector. The light signal transmitted through the demultiplexer 604 may be received by the receiver RX 609 and may be output as an electric signal through the optoelectronic converter 608.

Figure 27:
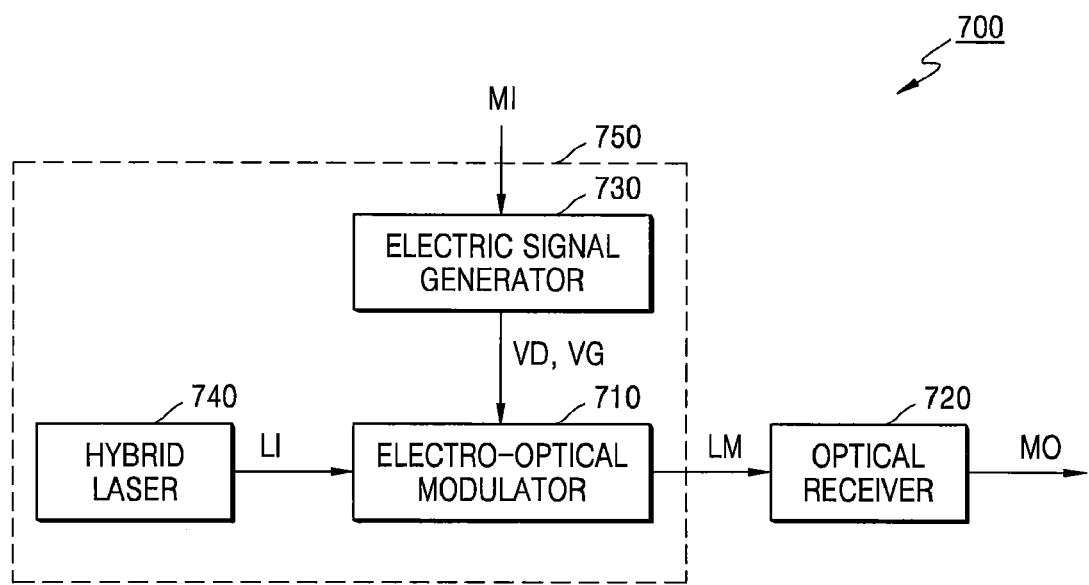
FIG. 27 is a block diagram illustrating an optical system using a hybrid silicon laser according to some embodiments of the present inventive concept.

Referring now to FIG. 27, a block diagram illustrating some embodiments of an optical system 700 using a hybrid silicon laser according to the present inventive concept will be discussed. In particular, the optical system 700 may include an electro-optical modulation circuit 750 and an optical receiver 720. The electro-optical modulation circuit 750 may include an electric signal generator 730 and an electro-optical modulator 710. The electric signal generator 730 may generate transmission electric signals VD and VG based on applied transmission data MI. The electro-optical modulation circuit 750 may include a hybrid silicon laser 740 according to some embodiments of the present inventive concept. The hybrid silicon laser 740 may correspond to each of the hybrid silicon lasers 100, 200, and 300 of FIGS. 1, 6, and 11.

The electro-optical modulator 710 may modulate a light signal LI received from the hybrid silicon laser 740 according to the transmitted electric signals VD and VG. The optical receiver 720 may generate received data MO in response to an opto-electric modulated light signal LM. The elements of the optical system 700 may be integrated on the same bulk silicon substrate.

Figure 28:
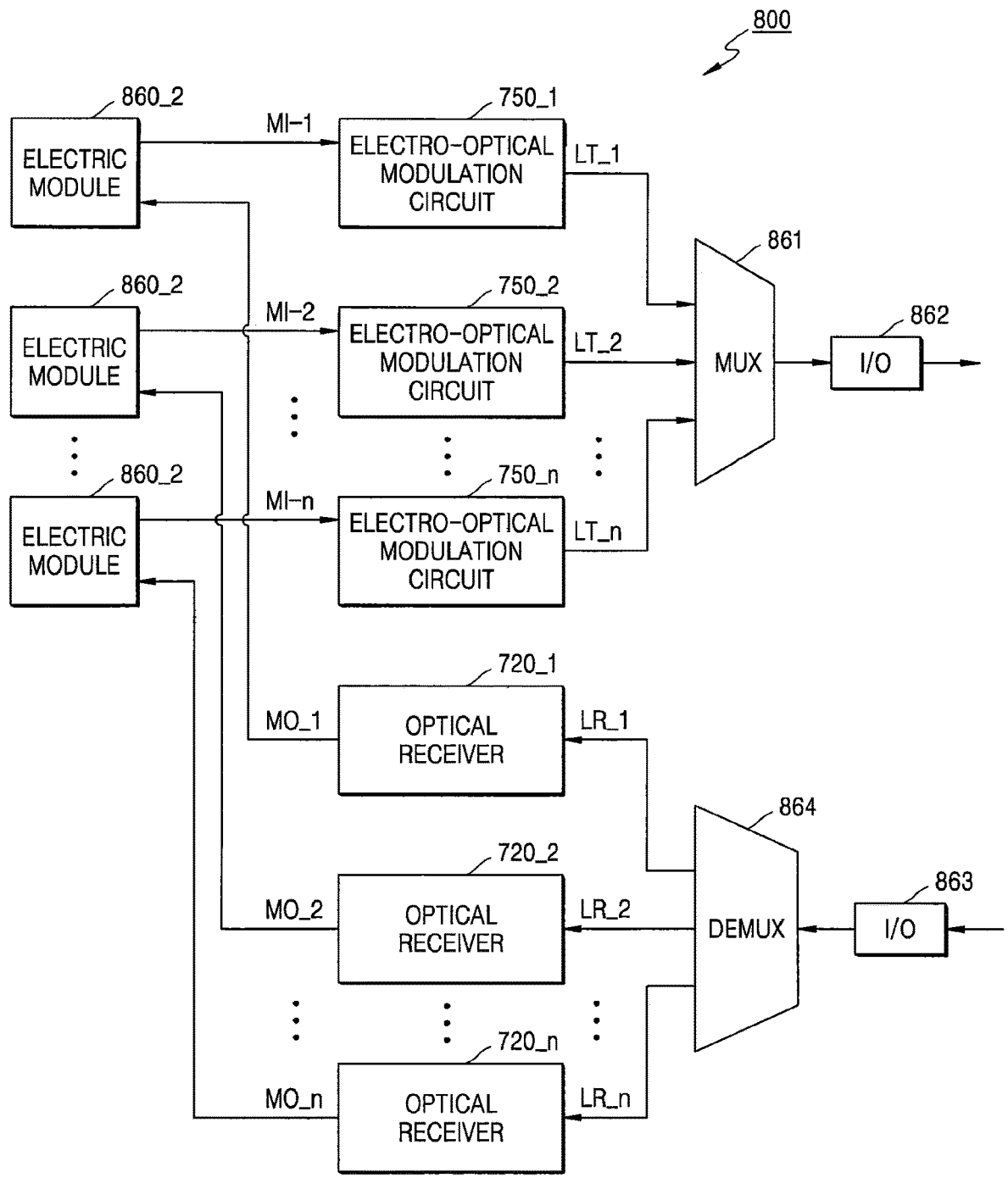
FIG. 28 is a block diagram illustrating an optical system using a hybrid silicon laser according to some embodiments of the present inventive concept.

Referring now to FIG. 28, a block diagram illustrating some embodiments of an optical system 800 using a hybrid silicon laser according to the present inventive concept will be discussed. In particular, the optical system 800 may include a plurality of electric modules 860_1 to 860_*n*, a plurality of electro-optical modulation circuits 750_1 to 750_*n*, an electric-optic modulation circuit, a multiplexer MUX 861, input/output circuits 862 and 863, and a plurality of optical receivers 720_1 to 720_*n*, and a demultiplexer DEMUX 864.

The electro-optical modulation circuits 750_1 to 750_*n* may respectively generate transmission light signals LT_1 to LT_*n* that are modulated based on pieces of transmission data MI_1 to MI_n input from the electric modules 860_1 to 860_*n*. The modulated transmission light signals LT_1 to LT_n may be light signals having different wavelengths. The electro-optical modulation circuits 750_1 to 750_*n* may include the hybrid silicon lasers 100, 200, and 300 of FIGS. 1, 6, and 11 according to some embodiments of the present inventive concept, as discussed with reference to FIG. 27.

The multiplexer 861 may generate light signals by using the modulated transmission light signals LT_1 to LT_n, and the transmission input/output circuit 862 may transmit the multiplexed light signal to an external apparatus. The external apparatus may be integrated on the same substrate as the optical system 800 or on a different substrate so that optical communication may be performed by using a separate optical communication path.

A receiving input/output circuit 863 may receive the multiplexed light signal transmitted from the external apparatus and may provide the received light signal to the demultiplexer 864. The demultiplexer 864 may demultiplex the multiplexed light signal input from the receiving input/output circuit 863 to modulated receiving light signals LR_1 to LR_n. The modulated receiving light signals LR_1 to LR_n may be light signals having different wavelengths. The optical receivers 720_1 to 720_n may respectively generate pieces of received data MO_1 to MO_n that are modulated based on the modulated receiving light signals LR_1 to LR_n, and may provide the generated the received data to the electric modules 860_1 to 860_n.

As described above, in the hybrid silicon laser according to the present inventive concept, the optical waveguide structure including the optical guide may be located on the localized insulating layer formed in a partial area of the bulk silicon substrate. Furthermore, in the hybrid silicon laser according to the present inventive concept, the lasing structure may be located on the optical waveguide structure.

Accordingly, since the hybrid silicon laser according to the present inventive concept is embodied on the bulk silicon substrate, the hybrid silicon laser may be easily integrated with an electric integrated circuit and also the hybrid silicon laser may be manufactured at a low cost compared to a case of embodying the hybrid silicon laser on the SOI substrate. Furthermore, in the hybrid silicon laser according to the present inventive concept, heat generated from the lasing structure may be easily exhausted through the bulk silicon substrate.

While the inventive concept has been particularly shown and described with reference to exemplary embodiments thereof, it will be understood that various changes in form and details may be made therein without departing from the spirit and scope of the following claims.

What is claimed is:

1. A method of manufacturing a hybrid silicon laser, the method comprising:
   forming a first trench in a part of a bulk silicon substrate;
   forming an insulating material layer on an entire surface of the bulk silicon substrate while filling the first trench;
   forming a localized insulating layer buried in the first trench by polishing the insulating material layer;
   forming a silicon layer on the localized insulating layer and the bulk silicon substrate;
   etching the silicon layer to form second trenches spaced apart from each other on the silicon layer remaining on the bulk silicon substrate, and to form a portion of the silicon layer located between the second trenches;
   forming an optical waveguide structure including an optical waveguide formed as the silicon layer remaining on the localized insulating layer and an optical guide layer including the second trenches spaced apart from each other;
   forming an electric connection layer on the optical waveguide structure;
   forming a lasing structure on the electric connection layer;
   forming a current injection confinement region in the lasing structure; and
   forming an electric terminal that is connected to the lasing structure,
   wherein the forming of the lasing structure comprises:
   before forming the electric connection layer, further forming an intermediate medium layer on the optical waveguide structure;
   forming a preliminary lasing structure on the electric connection layer, the preliminary lasing structure including a light-emitting composite layer including a Group III-V semiconductor gain layer, and a clad layer; and
   forming the lasing structure that exposes parts of a surface of the electric connection layer, by etching the preliminary lasing structure, and
   wherein the light-emitting composite layer includes a light-emitting layer capable of emitting light, and a first separate confinement heterostructure layer and a second separate confinement heterostructure layer respectively formed on lower and upper sides of the light-emitting layer.

2. The method of claim 1,
   wherein the electric connection layer is formed of n-type semiconductor.

3. The method of claim 1,
   wherein a depth of the first trench is less than a thickness of the bulk silicon substrate such that light is not emitted downward through the bulk silicon substrate.

4. The method of claim 1,
   wherein the localized insulating layer is formed as a material layer having a refractive index lower than a refractive index of the silicon layer included in the optical waveguide.

5. The method of claim 4,
   wherein the localized insulating layer is formed as a silicon oxide layer ($SiO_2$), a silicon oxynitride layer (SiON), or a silicon nitride layer (SiN).

6. The method of claim 1,
   wherein the forming of the silicon layer comprises:
   forming an amorphous silicon layer on entire surfaces of the localized insulating layer and the bulk silicon substrate; and
   forming a crystallized silicon layer by applying energy to the amorphous silicon layer.

7. The method of claim 1,
   wherein the forming of the optical waveguide structure comprises:
   forming a mask pattern on the silicon layer to expose parts of a surface of the silicon layer;
   forming the second trenches, the optical waveguide, and the optical guide layer by selectively etching the silicon layer by using the mask pattern as an etch mask; and
   removing the mask pattern.

8. The method of claim 7,
   wherein, when the second trenches are formed by selectively etching the silicon layer, bottoms of the second trenches are formed to be spaced apart from an upper surface of the localized insulating layer.

9. The method of claim 1,
   wherein a gas layer having a refractive index lower than a refractive index of the silicon layer is formed within the second trenches included in the optical guide layer.

10. The method of claim 1,
    wherein the second trenches included in the optical guide layer are filled with a silicon oxide layer, a silicon nitride layer, a silicon oxynitride layer, a polymer layer, or a spin-on-glass layer each having a refractive index lower than a refractive index of the silicon layer.

11. The method of claim 1,
    wherein a center point of a section of the optical waveguide is deviated from a center point of a section of the localized insulating layer in a lateral direction.

12. The method of claim 1, further comprising:
    forming a current confinement layer provided between the light-emitting layer and the second separate confinement heterostructure layer.

13. A method of manufacturing a hybrid silicon laser, the method comprising:
    forming a first trench in a part of a bulk silicon substrate;

forming an insulating material layer on an entire surface of the bulk silicon substrate while filling the first trench;

forming a localized insulating layer buried in the first trench by polishing the insulating material layer;

forming an optical waveguide structure on the localized insulating layer, the optical waveguide structure including an optical waveguide provided as a silicon layer and an optical guide layer located on both sides of the optical waveguide;

forming an intermediate medium layer on the optical waveguide structure;

forming an electric connection layer on the intermediate medium layer;

forming a mesa type or ridge type lasing structure on the electric connection layer, the mesa type or ridge type lasing structure including a clad layer and a light-emitting composite layer including a Group III-V semiconductor gain layer;

forming a current injection confinement region on the mesa type or ridge type lasing structure;

forming a side wall insulating layer on opposite side walls of the mesa type or ridge type lasing structure, wherein the side wall insulating layer is in contact with the electric connection layer, and forming an electric terminal that is electrically connected to the mesa type or ridge type lasing structure, wherein the light-emitting composite layer includes a light-emitting layer capable of emitting light, and a first separate confinement heterostructure layer and a second separate confinement heterostructure layer respectively formed on lower and upper sides of the light-emitting layer, and a current confinement layer is further provided between the light-emitting layer and the second separate confinement heterostructure layer.

14. The method of claim 13, further comprising:
forming a surface insulating layer on the intermediate medium layer.

15. The method of claim 13, wherein the current injection confinement region is a current confinement impurity region provided in the light-emitting composite layer and the clad layer, and the current confinement impurity region is an ion injection region into which protons are injected.

16. The method of claim 13, wherein the light-emitting composite layer comprises one of a quantum well and a quantum dot, and a center point of a section of the optical waveguide is deviated from a center point of a section of the localized insulating layer.

17. A method of manufacturing a hybrid silicon laser, the method comprising:
forming a trench in a part of a bulk silicon substrate;
forming an insulating material layer on an entire surface of the bulk silicon substrate while filling the trench;
forming a localized insulating layer buried in the trench by polishing the insulating material layer;
forming a silicon layer on the localized insulating layer and the bulk silicon substrate;
forming an optical waveguide structure including an optical waveguide and an optical guide layer located on both sides of the optical waveguide, by etching the silicon layer;
forming an intermediate medium layer on the optical waveguide structure;
forming a preliminary lasing structure on a semiconductor substrate, the preliminary lasing structure including a clad layer, a light-emitting composite layer including a current confinement layer, and an electric connection layer;
combining the intermediate medium layer on the optical waveguide structure with the electric connection layer of the preliminary lasing structure;
separating the semiconductor substrate from the preliminary lasing structure;
forming a lasing structure that exposes parts of a surface of the electric connection layer, by etching the preliminary lasing structure including the clad layer, the light-emitting composite layer including the current confinement layer, and the electric connection layer, wherein the lasing structure comprises a Group III-V semiconductor gain layer coupled to the optical waveguide structure;
forming a current injection confinement region in the lasing structure; and
forming an electric terminal that is electrically connected to the lasing structure,
wherein the light-emitting composite layer includes a light-emitting layer capable of emitting light, and a first separate confinement heterostructure layer and a second separate confinement heterostructure layer respectively formed on lower and upper sides of the light-emitting layer.

18. The method of claim 17,
wherein the intermediate medium layer and the electric connection layer are combined with each other by applying heat to the semiconductor substrate and the bulk silicon substrate.

19. The method of claim 17,
wherein the localized insulating layer is formed as a silicon oxide layer (SiO2), a silicon oxynitride layer (SiON), or a silicon nitride layer (SiN) each having a refractive index lower than a refractive index of the silicon layer included in the optical waveguide, and a center point of a section of the optical waveguide is deviated from a center point of a section of the localized insulating layer.

* * * * *